United States Patent
Tadatsu

(10) Patent No.: US 7,218,092 B2
(45) Date of Patent: May 15, 2007

(54) MAGNETIC BRIDGE TYPE CURRENT SENSOR, MAGNETIC BRIDGE TYPE CURRENT DETECTING METHOD, AND MAGNETIC BRIDGE FOR USE IN THAT SENSOR AND DETECTING METHOD

(75) Inventor: Takashi Tadatsu, Koga (JP)

(73) Assignee: Loyal Port Company Limited, Fukuoka (JP)

( * ) Notice: Subject to any disclaimer, the term of this patent is extended or adjusted under 35 U.S.C. 154(b) by 117 days.

(21) Appl. No.: 10/518,425

(22) PCT Filed: Jun. 18, 2003

(86) PCT No.: PCT/JP03/07729

§ 371 (c)(1),
(2), (4) Date: Dec. 17, 2004

(87) PCT Pub. No.: WO03/107017

PCT Pub. Date: Dec. 24, 2003

(65) Prior Publication Data

US 2006/0066292 A1    Mar. 30, 2006

(30) Foreign Application Priority Data

Jun. 18, 2002  (JP) .............................. 2002-176894
Apr. 4, 2003   (JP) .............................. 2003-101353

(51) Int. Cl.
*G01R 33/00*   (2006.01)
(52) U.S. Cl. ..................... 324/110; 324/117 R; 324/127
(58) Field of Classification Search ..................... None
See application file for complete search history.

(56) References Cited

U.S. PATENT DOCUMENTS 4,182,982 A  *  1/1980  Wolf et al. ................. 324/127

(Continued)

FOREIGN PATENT DOCUMENTS

JP           63-212883           5/1987

(Continued)

OTHER PUBLICATIONS

JP2000-055940, JP10-332745, JP10-010161, JP2000-249727. A machine translation has been provided for the listed documents.

(Continued)

*Primary Examiner*—Minh N. Tang
(74) *Attorney, Agent, or Firm*—Duane Morris LLP

(57) ABSTRACT

A current sensor and a current detecting method in which a sensitivity in at least 100 μA region and a dynamic range of 80 dB are achieved through a simple structure. The current sensor comprises one middle leg magnetic circuit (1) having opposite ends, two outer leg magnetic circuit (2a,2b) being connected with one and the other ends of the middle leg magnetic circuit (1), respectively, an exciting means (3a) arranged in the outer leg magnetic circuit (2a) and exciting means (3b) arranged in the outer leg magnetic circuit (2b), a flux detecting, means (4) arranged in the middle leg magnetic circuit (1), means (7) for driving the exciting means (3a,3b), and a detection circuit (8) connected with the flux detecting means (4) and outputting an electric signal interlocked with the flux being detected by the flux detecting means (4).

14 Claims, 18 Drawing Sheets

U.S. PATENT DOCUMENTS 5,523,677 A * 6/1996 Kawakami et al. ..... 324/117 R
6,490,180 B2 * 12/2002 Hiltunen et al. ......... 363/21.16

FOREIGN PATENT DOCUMENTS

| | | |
|---|---|---|
| JP | 10-010161 | 1/1998 |
| JP | 10-332745 | 12/1998 |
| JP | 2000-055940 | 2/2000 |
| JP | 2000-249727 | 9/2000 |

OTHER PUBLICATIONS

JP63-212883. An English abstract has been provided for the listed document.

* cited by examiner

MAGNETIC BRIDGE TYPE CURRENT SENSOR, MAGNETIC BRIDGE TYPE CURRENT DETECTING METHOD, AND MAGNETIC BRIDGE FOR USE IN THAT SENSOR AND DETECTING METHOD

FIELD OF THE INVENTION

The present invention relates to a current sensor detecting a current without connection to a detected wire, with isolated condition maintained, with respect to alternating current, such as the well known Current Transformer (CT), and particularly to the current sensor capable of detecting direct current with respect to frequency characteristic and detecting the micro current in the range of 100 μA with respect to current value. Also, the present invention relates to the magnetic bridge used in the current sensor and current detecting method.

BACKGROUND OF THE INVENTION

The well-known CT is advantageous in that the detection is possible with isolation from the detected wire, but it can not be used with respect to direct current, alternating current with a frequency close to direct current, and pulsating current with direct current and alternating current superposed. Then, as an alternative to the CT, other isolation type direct current sensors were proposed such as hall element type, magnetic amplifier type, magnetic multi vibrator type, magnetic flux inversion time difference type (for example, see the patent application laid open Nos. H10-10161, H10-332745), magnetic path chopping type (for example, see the patent application laid open No. 2000-55940), etc.

In the hall element type, a gap is formed in a part of the magnetic core through which the detected wire passes and is provided with a hall element such that the value of current running along the detected wire is detected from the variation of electric characteristic value of the concerned hall element. In the magnetic amplifier type and the magnetic multi vibrator type, the value of current running along the detected wire is detected using the time difference reaching the saturation of alternating flux generated by magnetically exciting a magnetic core to the vicinity of saturation flux density in advance with alternating current to magnetically polarize it with direct current. The three types mentioned above are suitable for the case in which current sensitivity per 1 turn of the detected wire is not less than several ampere, but can not detect the current of several mA.

In the magnetic flux inversion time difference type, the triangular exciting current that exceeds sustaining force is run along the magnetic core, which the detected wire passes through, and the period of time from when the flux in the magnetic core starts to run in one direction to when the direction of the flux is inverted toward the other direction is compared with the period of time from when the flux starts to run toward the other direction to when the direction of the flux is inverted toward the opposite, so the direct current of the detected wire is detected. Particularly, in the feedback type (see the above second reference), its structure is complicated and the uniformity of quality between products is lacking, because the plurality of magnetic cores are used and the plurality of coils such as the coils wound around single magnetic core, the coils wound over the plurality of magnetic cores, etc. are present. In no feedback type (see the above patent application laid open No. H10-10161), current sensitivity per 1 turn of the detected wire is about 100 mA and dynamic range is narrow.

In the magnetic path chopping type, saturating a part of the magnetic core, which is passed through by the detected wire, with the flux of which the direction is perpendicular to that of the flux generated by the detected wire and increasing the magnetic reluctance of the magnetic core are intermittently carried out in time series. Namely, in this type of which the basic principle is identical with the well-known chopper amplifier, the value of direct magnetic flux, that is, the value of direct current running along the detected wire, is detected by chopping the direct magnetic flux generated by the detected wire to alternating magnetic flux. This type is very complicated in winding of coils, shape of the magnetic core, etc. when compared with other types.

Besides, saturation type (Cramer type), zero flux type, etc. are all for detecting high current, and measurement of current in the range of several mA is difficult.

As mentioned above, in the prior art of direct current sensor, current sensitivity per 1 turn of the detected wire is bad, and a sensor that has relatively good sensitivity is very complicated in the structure.

Currently, preservation of the environment has become an issue of public concern such that direct current like solar power, fuel cell, etc. is becoming more important and the increase of demand on direct current power equipment using the secondary cell, such as electric vehicles, hybrid vehicles, etc. is anticipated. In addition, from the aspect of energy saving, current detection by magnetic field in which energy consumption is close to a perfect zero is preferred in the art using the prior shunt resistors. In direct current and high voltage circuits used in high voltage electron tubes, etc., current tends to become lower if voltage becomes higher, and it is preferred that the current in high voltage circuit is measured under isolation.

However, in the prior art, there are no current sensor and current detecting method by which the sensitivity and dynamic range corresponding to the above-mentioned concerns are achieved and the cost of manufacturing is economical such that the wide use for the general purpose is possible.

DISCLOSURE OF THE INVENTION

A current sensor of claim 1 according to the present invention of which the object is to solve the above-mentioned concerns, is characterized by comprising:

one middle leg magnetic circuit (1) having opposite ends;

two outer leg magnetic circuits (2a,2b) connected with one and the other ends of the middle leg magnetic circuit (1), respectively;

an exciting means (3a) arranged in the outer leg magnetic circuit (2a) and an exciting means (3b) arranged in the outer leg magnetic circuit (2b);

a flux detecting means (4) arranged in the middle leg magnetic circuit (1);

drive means (7) for driving the exciting means (3a,3b), respectively; and a detection circuit (8) connected with the flux detecting means (4) and outputting the electric signals interlocked with the flux being detected by the flux detecting means (4).

Also, a current sensor of claim 2 according to the present invention is characterized by, in addition to the configuration of claim 1, further comprising:

a balance recovery coil (5) arranged by winding a wire around at least one of the middle leg magnetic circuit (1) and the outer leg magnetic circuits (2a,2b);

a balance recovery current controlling circuit (9) for controlling the balance recovery current run along the balance recovery coil (5) to decrease the flux being detected by the flux detecting means (4), based on the electric signals being output from the detection circuit (8); and a detected value outputting circuit (10) for outputting the balance recovery current value.

Next, a current detecting method of claim 3 according to the present invention is characterized by comprising:

achieving magnetic balance condition by generating the first excited flux, which is an alternating flux, to run along a middle leg magnetic circuit (1) by an exciting means (3a) and generating the second excited flux, of which the magnitude is as same as that of the first excited flux and the direction is reverse to that of the first excited flux, which is an alternating flux to run along the middle leg magnetic circuit (1) by an exciting means (3b);

achieving magnetic non-balance condition due to collapse of the magnetic balance condition, which is caused by running detected current along a detected wire (6) passed through at least one of the window which is formed by being surrounded by an outer leg magnetic circuit (2a) and the middle leg magnetic circuit (1) and the window which is formed by being surrounded by an outer leg magnetic circuit (2b) and the middle leg magnetic circuit (1) to vary the magnetic reluctance of the outer leg magnetic circuit (2a) and the outer leg magnetic circuit (2b); and detecting the detected current running along the detected wire (6) by detecting the flux which is generated along the middle leg magnetic circuit (1) through achieving the magnetic non-balance condition, by a detection circuit (8) outputting the electric signals interlocked with the flux being detected by a flux detecting means (4).

Also, another current detecting method of claim 4 according to the present invention is characterized by comprising:

achieving magnetic balance condition by generating the first excited flux which is an alternating flux to run along a middle leg magnetic circuit (1) by an exciting means (3a) and generating the second excited flux, of which the magnitude is as same as that of the first excited flux and the direction is reverse to that of the first excited flux, which is an alternating flux to run along the middle leg magnetic circuit (1) by an exciting means (3b);

achieving magnetic non-balance condition due to collapse of the magnetic balance condition, which is caused by running detected current along a detected wire (6) passed through at least one of the window which is formed by being surrounded by an outer leg magnetic circuit (2a) and the middle leg magnetic circuit (1) and the window which is formed by being surrounded by an outer leg magnetic circuit (2b) and the middle leg magnetic circuit (1) to vary the magnetic reluctance of the outer leg magnetic circuit (2a) and the outer leg magnetic circuit (2b);

achieving magnetic re-balance condition by running balance recovery current along a balance recovery coil (5) to decrease the flux being generated along the middle leg magnetic circuit (1) in the condition that magnetic reluctance of the outer leg magnetic circuit (2a) and the outer leg magnetic circuit (2b) is varied, wherein the balance recovery current, which generates the flux of which the magnitude is as same as that of the flux being generated along the magnetic circuit around which the detected wire (6) is wound by being passed therethrough in the condition that the magnetic reluctance of the outer leg magnetic circuit (2a) and the outer leg magnetic circuit (2b) is varied and the direction is reverse to that of the said flux, is run along the balance recovery coil (5) which is wound by being passed through the same window as the window through which the detected wire (6) is passed; and detecting the detected current running along the detected wire (6) by detecting the balance recovery current running along the balance recovery coil (5) in the magnetic re-balance condition.

DETAILED DESCRIPTION OF THE PREFERRED EMBODIMENTS

Hereinafter, embodiments of the current sensor of the present invention and their working will be described with reference to the accompanying drawings.

Figure 1:
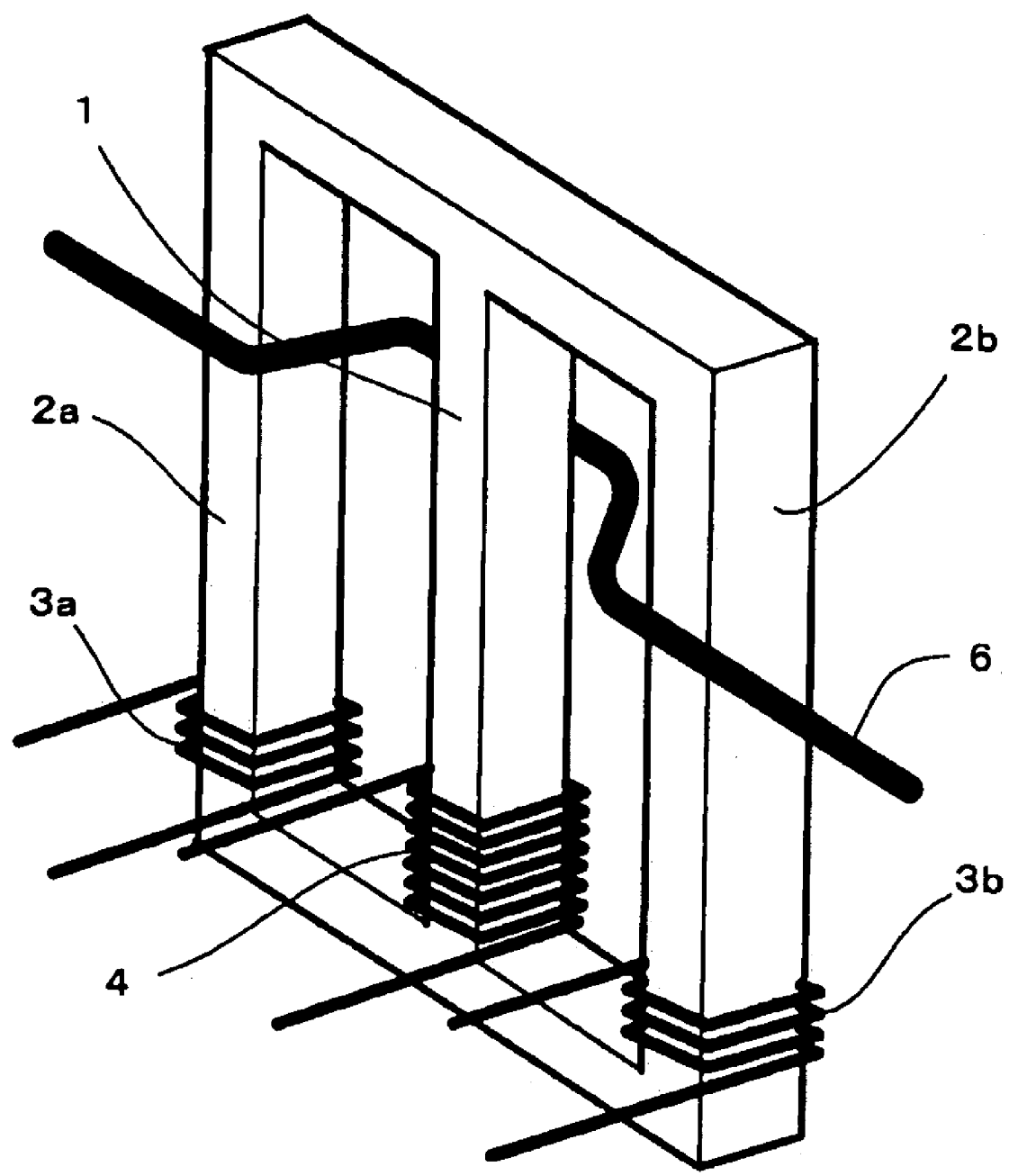
FIG. 1 is a perspective view of the main portion of a magnetic bridge type current sensor according to the present invention (hereinafter, referred to as the current sensor of the present invention) in which a balance recovery coil is not arranged.

FIG. 1 is a perspective view schematically showing the magnetic bridge type current sensor of the present invention relating to claim 1, by an example (In FIG. 1, drive means (7) and a detection circuit (8) are not shown).

A current sensor of the present invention illustrated in FIG. 1 is provided with one middle leg magnetic circuit (1) having opposite ends, and two outer leg magnetic circuits (2a,2b) connected with one and the other ends of the middle leg magnetic circuit (1), respectively, the middle leg magnetic circuit (1) is provided with a flux detecting means (4), the outer leg magnetic circuit (2a) is provided with an exciting means (3a), and the outer leg magnetic circuit (2b) is provided with and exciting means (3b). Both of the exciting means (3a) and the exciting means (3b) are formed to generate an alternating magnetic field. In the present invention, the above-mentioned structure is often referred to as "magnetic bridge". The respective magnetic circuits (1,2a,2b) in the above magnetic bridge is formed of magnetic material such as ferrite, silicon steel, amorphous, Permalloy, etc., and, in the present specification, the magnetic substance forming the magnetic circuits is often referred to as "core material" or "core". Further, the current sensor of the present invention is also provided with the detection circuit (8), although it is not shown in FIG. 1.

The above-mentioned exciting means (3a) and exciting means (3b) may generate alternating magnetic field or conduct alternating current to the wound wire (hereinafter, referred to as "coil") indicated in FIG. 1. The alternating magnetic field may generated by rotating or vibrating a permanent magnet body or its magnetic path, by alternating a magnetic fluid using a permanent magnet and the magnetic fluid, by varying the magnetic reluctance of magnetic path of electromagnet or permanent magnet, etc., by the method selected as needed.

Magnetic detection elements such as hall elements, magnetic impedance elements, etc. may be used as the flux detecting means (4). When the magnetic detection element is used as the flux detecting means (4), it is required for a gap to be arranged in a part of the middle leg magnetic circuit such that the magnetic detection element is arranged in the gap. However, the configuration of the flux detecting means (4) becomes simple, if the wire wound around the middle leg magnetic circuit (1) (hereinafter, referred to as the detecting coil) is used as the flux detecting means, as indicated in FIG. 1.

As the detection circuit (8), any one will do if it is capable of outputting the flux detected by the flux detecting means (4) as electric signals. For example, for the purpose of low precision in detection, the circuit which only outputs the potential difference generated across the magnetic detection element or electromotive force generated across the detecting coil by the detection of the flux by the detecting coil or magnetic detection element used as the flux detecting means (4), namely, the circuit in which the detecting coil or the magnetic detection element are only connected with the output by simple wire, will do.

As detection circuit (8), a circuit in which one or more of active elements such as diode, etc. and passive elements such as resistor, capacitor, etc. are connected may be used, and also, an active circuit, etc. using operational amplifier, etc. may be used. Namely, the detection circuit (8) may employ the various configuration such as the configuration in which anything remains raw to be used freely as needed, the configuration in which some elements are added for operational stabilization of the detecting coil or the magnetic detection element, the configuration in which the signal processing, which is enough to directly read the detected current like the indicator indicating the potential difference generated across the magnetic detection element or the electromotive force generated across the detecting coil, is carried out to the potential difference generated across the magnetic detection element or the electromotive force generated across the detecting coil, etc.

The measurement of the detected current running along the detected wire (6) is carried out by passing the detected wire (6) through at least one of the window which is formed by being surrounded by one outer leg magnetic circuit (2a) and the middle leg magnetic circuit (1) and the window which is formed by being surrounded by the other outer leg magnetic circuit (2b) and the middle leg magnetic circuit (1).

In FIG. 1, the detected wire (6) is arranged to pass, from the front side to the opposite side, through the one window which is formed by being surrounded by the outer leg magnetic circuit (2a) and the middle leg magnetic circuit (1) and also pass, from the opposite side to the front side, through the other window which is formed by being surrounded by the outer leg magnetic circuit (2b) and the middle leg magnetic circuit (1). Electromagnetically, the turns of the wire in the magnetic circuit provided with the window, which is formed by being surrounded by the outer leg magnetic circuits (2a or 2b) and the middle leg magnetic circuit, are the same as the number of times the wire passes through the concerned window.

Accordingly, in the case that the detected wire (6) is arranged as indicated in FIG. 1, the detected wire (6) is electromagnetically considered to be wound around the middle leg magnetic circuit (1) one time, and this is equivalent to winding the wire altogether around the outer leg magnetic circuit (2a) and the outer leg magnetic circuit (2a) one time. Also, in the case that the detected wire (6) is arranged to be passed through only one window from the front side to the opposite side, the detected wire (6) is electromagnetically considered to be wound around the outer leg magnetic circuit (2a) one time, and this is equivalent to winding the wire altogether around the middle leg magnetic circuit (1) and the outer leg magnetic circuit (2b) one time.

Next, the magnetic condition of the above-mentioned "magnetic bridge" is described.

The alternating flux (hereinafter, referred to as "the first excited flux") running from the outer leg magnetic circuit (2a) into the middle leg magnetic circuit (1) is generated, when the outer leg magnetic circuit (2a) is magnetically excited by the exciting means (3a). Also, The alternating flux (hereinafter, referred to as "the second excited flux") running from the outer leg magnetic circuit (2b) into the middle leg magnetic circuit (1) is generated, when the outer leg magnetic circuit (2b) is magnetically excited by the exciting means (3b). In this case, if the magnetic excitation by the exciting means (3a) and the exciting means (3b) is carried out by determining the magnetomotive force of the exciting means (3a) and the exciting means (3b) such that the magnitude of the first excited flux is as same as that of the second excited flux and the direction of the first excited flux is reverse to that of the second excited flux, the total flux running into the middle leg magnetic circuit (1) is zero because the magnitude of the first excited flux is as same as that of the second excited flux and the direction of the first excited flux is reverse to that of the second excited flux.

Therefore, hereinafter in the specification, the flux condition in which the magnitude of the first excited flux is as same as that of the second excited flux and the direction of the first excited flux is reverse to that of the second excited flux is referred to as "balance flux condition", the excitation condition of the exciting means (3a) and the exciting means (3b), by which the balance flux condition is achieved, is referred to as "balance excitation condition", and the condition, in which the total flux running into the middle leg magnetic circuit (1) is zero because the magnitude of the first excited flux is as same as that of the second excited flux and the direction of the first excited flux is reverse to that of the second excited flux, is referred to as "magnetic balance condition".

When the magnetic bridge is under the magnetic balance condition, for example, the total flux running into one end of the middle leg magnetic circuit (1), which is one point of any points of the middle leg magnetic circuit (1), has already been zero, because the flux running into the one end of the middle leg magnetic circuit (1) is only the first excited flux and the second excited flux and also the total flux is zero. As a result, any value other than zero is not adopted because the flux of the middle leg magnetic circuit (1) connected with the concerned any one point essentially becomes zero. Namely, in the present invention, when the magnetic bridge is under magnetic balance condition, the flux is not detected by the flux detecting means (4) because the flux within the middle leg magnetic circuit (1) is not present.

The achievement of the balance condition in the magnetic bridge may be carried out by driving the drive means such that the magnetomotive force of the exciting means (3a) and the exciting means (3b) satisfies the balance condition of the flux, and also may be simply carried out by forming the outer leg magnetic circuit (2a) and the outer leg magnetic circuit (2b) such that they are made of the same magnetic material and their dimensions are same, forming both the exciting means (3a) and the exciting means (3b) of coils such that the turns of the coils of both exciting means (3a,3b) become same, arranging the coil of the exciting means (3a) and the coil of the exciting means (3b) such that the direction of the winding of the coils is reverse to each other, and arranging the coil of the exciting means (3a) and the coil of the exciting means (3b) in serial such that alternating current is conducted, because the current values and the phases are same.

In the case that the magnetic bridge is under magnetic balance condition and the detected wire (6) is arranged to be passed through at least one of the window which is formed by being surrounded by the outer leg magnetic circuit (2a) and the middle leg magnetic circuit (1) and the window which is formed by the outer leg magnetic circuit (2b) and the middle leg magnetic circuit (1), flux is newly generated along the magnetic bridge, when the detected current runs along the detected wire (6)

In FIG. 1, the direction of the flux generated along the middle leg magnetic circuit (1) by the detected current is from the upper side to the lower side, if the detected current runs from the opposite side to the front side (hereinafter, this direction is referred to as "positive direction", and the reverse direction is referred to as "negative direction"). The flux of the middle leg magnetic circuit (1) by the detected current in the positive direction gathers, in the upper end of the middle leg magnetic circuit (1), into the concerned end from the outer leg magnetic circuit (2a) and the outer leg magnetic circuit (2b), runs along the middle leg magnetic circuit (1) from the upper side to the lower side, and branches, in the lower end of the middle leg magnetic circuit (1), away into the outer leg magnetic circuit (2a) and the outer leg magnetic circuit (2b). Also, the flux runs along the outer leg magnetic circuit (2a) and the outer leg magnetic circuit (2b) from the lower side to the upper side.

In the case that the balance excitation condition is satisfied in the magnetic bridge, and the clockwise flux runs along the outer leg magnetic circuit (2a) and the outer leg magnetic circuit (2b), the flux by the detected current and the excited flux by the exciting means (3a), in the outer leg magnetic circuit (2a), have the same direction, and thus, the flux gets to increase, while the flux by the detected current and the excited flux by the exciting means (3b), in the outer leg magnetic circuit (2b), have the reverse direction, and thus, the flux gets to decrease.

In the case that the maximum of the flux density within the magnetic bridge is not more than the value of the flux density which becomes the maximum of the permeability of the magnetic material forming the concerned magnetic bridge, the increase of the flux, in the outer leg magnetic circuit (2a), results in the increase of the permeability to decrease the magnetic reluctance of the concerned magnetic circuit. On the other hand, the decrease of the flux, in the outer leg magnetic circuit (2b), results in the decrease of the permeability to increase the magnetic reluctance of the concerned magnetic circuit. The decrease of the magnetic reluctance in the outer leg magnetic circuit (2a) results in the increase of the first excited flux and the increase of the magnetic reluctance in the outer leg magnetic circuit (2b) results in the decrease of the second excited flux. As a result, flux is generated along the middle leg magnetic circuit (1), because the balance flux condition is not satisfied.

As understood from the above description, the flux running through the middle leg magnetic circuit (1) is zero when the detected current is zero, and the increase of the detected current causes the increase of the variation of the magnetic reluctance such that the flux running through the middle leg magnetic circuit (1) gets to increase. Namely, the magnitude of the flux in the middle leg magnetic circuit (1) is proportional to the magnitude of the detected current. Also, if the flux detecting means (4) is a coil, the electromotive force across the flux detecting means (4) is generated by the flux generated along the middle leg magnetic circuit (1), and, if the flux detecting means (4) is a magnetic detection element, the potential difference, etc., across the flux detecting means (4) is generated by the flux generated along the middle leg magnetic circuit (1). At this time, the magnitude of the electromotive force or the potential difference, etc., generated across the flux detecting means (4) is proportional to the magnitude of the flux being generated along the middle leg magnetic circuit (1).

Since the magnetic bridge is electromagnetically symmetrical with respect to the middle leg magnetic circuit (1), the same result as the above-mentioned example is caused even when the counterclockwise flux runs along the outer leg magnetic circuit (2a) and the outer leg magnetic circuit (2b).

This characteristic means that, when the maximum of the flux density within the magnetic bridge is not more than the maximum of the permeability, the flux of the middle leg magnetic circuit (1) is varied by two periods for one period of the excited flux. Also, the component varying by four periods for one period of the excited flux is included in the flux of the middle leg magnetic circuit (1) when the maximum of the flux density within the magnetic bridge exceeds the maximum of the permeability. However, in both cases, the flux including the higher harmonics is generated along the middle leg magnetic circuit (1) because the characteristic of magnetic field to permeability in the magnetic material is non-linear.

By the detection circuit (8), the detected current is detected by outputting the flux generated along the middle leg magnetic circuit (1) in the form of electric signals interlocked with the flux being detected by the flux detecting means (4). If the output of the detection circuit (8) is connected to an indicator, the value of the electric signals output by the detection circuit (8) can be directly read by means of the indicator. The output of the detection circuit (8), alone or together with the indication by the indicator, may be transferred to or stored as detection data in a computer, etc.

Next, the current sensor of the present invention in claim 2 and the current detecting method of the present invention in claim 4 are described.

In the detection of current as mentioned above, if the detected current runs along the detected wire (6), the magnetic balance condition in the magnetic bridge is broken because the magnetic reluctance of the magnetic bridge becomes varied, even when the balance excitation condition is satisfied. Therefore, if the excitation by use of the exciting means generating flux is carried out to the magnetic circuit in the position where the detected wire (6) is wound in the magnetic bridge such that the flux generated by the detected current breaking the magnetic balance condition in the magnetic bridge becomes zero, the magnetic bridge again becomes under the magnetic balance condition. In the present invention, recovering the magnetic bridge to the magnetic balance condition from the condition in which the magnetic balance condition is broken by the detected current is referred to as "balance recovery", and the magnetic condition recovered to balance condition by the balance recovery is referred to as "magnetic re-balance condition".

Figure 2:
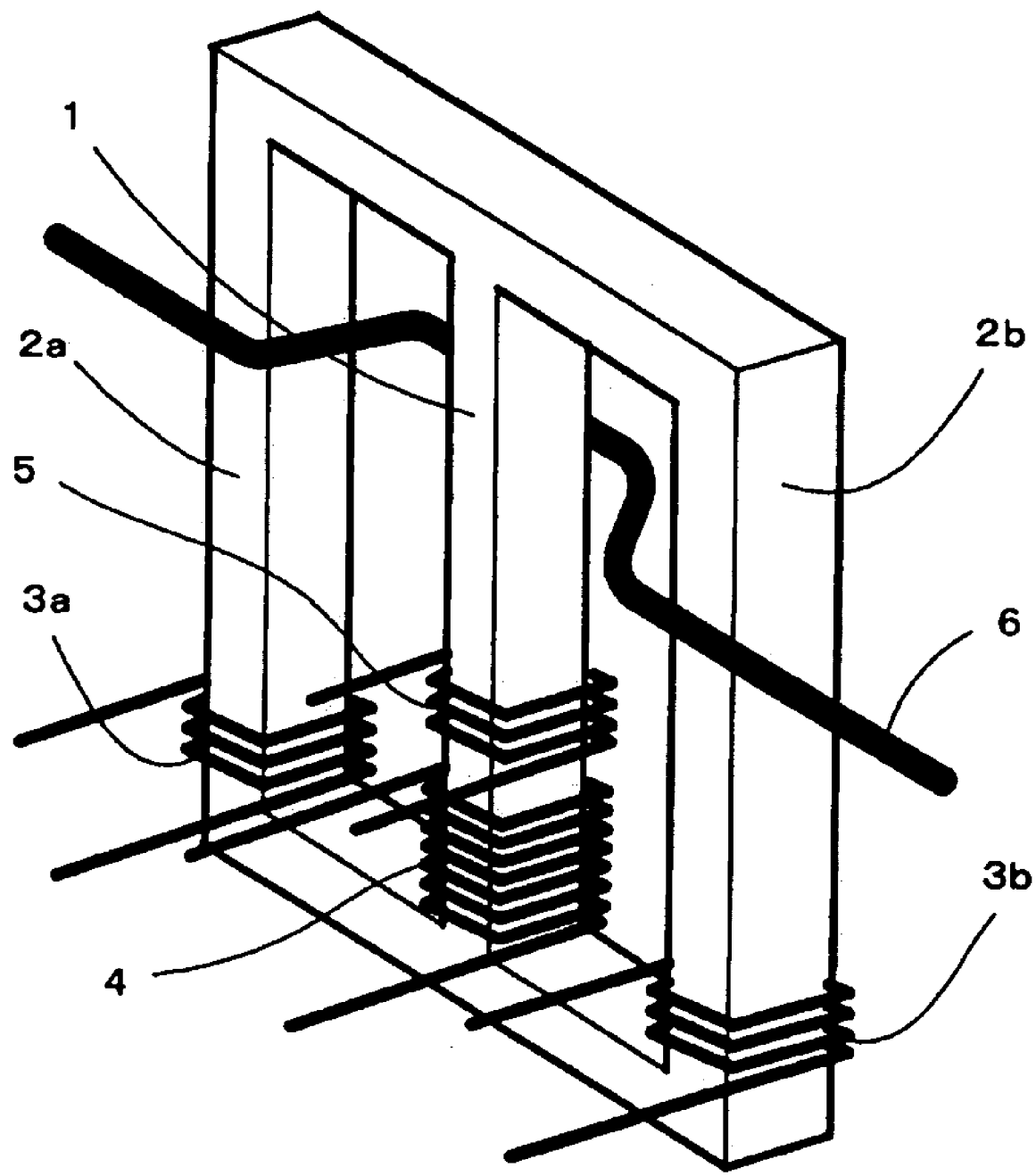
FIG. 2 is a perspective view of the main portion of the current sensor of the present invention with a balance recovery coil arranged.

In the present invention, the balance recovery coil (5) as indicated in FIG. 2 is an exciting means generating flux along the magnetic circuit in the position where the detected wire (6) is wound in the magnetic bridge, and is also the means achieving the magnetic re-balance condition. In the configuration of FIG. 2, the balance recovery coil (5) is arranged in the middle leg magnetic circuit (1) since the configuration is equivalent to the configuration in which the detected wire (6) is wound altogether around the middle leg magnetic circuit (1) or the outer leg magnetic circuit (2a) and the outer leg magnetic circuit (2b). In addition, as exampled in FIG. 10, the balance recovery coil (5) is arranged in the outer leg magnetic circuit (2a) since the detected wire (6) is wound around the outer leg magnetic circuit (2a).

The magnetic condition in which the magnetic balance condition is broken by the detected current running along the detected wire (6) is recovered to balance, if along the balance recovery coil (5) runs the current (hereinafter, referred to as "balance recovery current") generating the flux of which the magnitude is as same as that of the flux by the detected current and the direction is reverse to the flux by the detected current.

Representing the relation between the detected current and the balance recovery current, by the detailed example, in the case that the detected current is 100 mA and the turns of the detected wire (6) is 1, the relation between the turns of the balance recovery coil (5) and the magnitude of the balance recovery current is indicated as the follows; the balance recovery current is 100 mA where the turns is 1, and the balance recovery current is 10 mA where the turns is 10. Namely, balance recovery means controlling by which the product of the turns of the balance recovery coil (5) and the balance recovery current become the same as the product of the turns of the detected wire (6) and the detected current. Further, in this case, connection is carried out such that the direction of the magnetomotive force is reverse. In addition, the magnetomotive force is electromagnetically represented as the product of the turns and the current value.

Since the turns of the balance recovery coil (5) and the detected wire (6) is already known, the detected current can be detected by detecting the balance recovery current. Namely, the detected current is the product of the balance recovery current and the turn-ratio, where the turn-ratio is the value of the turns of the balance recovery coil (5) divided by the turns of the detected wire (6).

Next, in the case that the detected current is in the negative direction, the flux generated along the middle leg magnetic circuit (1) by the detected current runs from the lower side to the upper side, and basically, the magnetic effect is the same as the effect when the detected current is in the positive direction because the state in this case magnetically becomes as same as the state which is inverted up and down with respect to the state when the detected current is in the positive direction. However, the polarity in the result of detection becomes reverse because the direction of the flux passing through the flux detecting means (4) becomes reverse. Therefore, the direction of the detected current can be found by checking the polarity in this result of detection. Namely, the magnitude of the detected current can be found from the magnitude of the result of detecting the balance recovery current and also the direction of the detected current can be found from the polarity of the above result, respectively.

Whether the balance recovery has been achieved or not can be determined by detecting, by the detection circuit (8), the flux along the middle leg magnetic circuit (1) to check whether the result of detection is close to zero or not. When the balance recovery is carried out manually, the balance recovery current may be adjusted such that the value of the result of detection is close to zero, while the result of the detection by the detection circuit (8) is observed by the instruments such as voltmeter, galvanometer, etc. The method of manually carrying out this adjustment is suitable for the special use such as the experiment of working principle, etc., and the method of automatically carrying out this adjustment is preferred when the practical use is needed.

As a method of automatically carrying out the balance recovery, there is the method of feedback controlling the balance recovery current with the result of detection by the detection circuit (8) detecting the flux along the middle leg magnetic circuit (1). By this feedback control method, the value of the input signal in control system divided by "amplification factor+1" in feedback loop remains in the position under feedback. Namely, in the magnetic bridge as indicated in FIG. 2, the position under feedback is the flux within the middle leg magnetic circuit (1), and the flux remaining within the middle leg magnetic circuit (1) by the feedback control is the flux resulting from dividing the flux originally generated within the middle leg magnetic circuit (1) by the detected current when no feedback control by the "amplification factor+1" in the feedback loop.

As a specific example, in the case that the detected current is 100 mA and the amplification factor in feedback loop is 100000, the flux, of the flux passing through the flux detecting means (4), corresponding to the value of 100 mA divided by 100001, namely, about 0.9999 µA remains. Also, when the amplification factor in the feedback loop is 99999, the flux corresponding to 1 µA remains. This condition which is not perfect magnetic balance condition but is very close to the magnetic balance condition, including the magnetic balance condition, is referred to as "magnetic quasi-balance condition". Also, under the "magnetic quasi-balance condition", the influence of the magnetic reluctance of the middle leg magnetic circuit (1) by the flux remaining in the middle leg magnetic circuit (1) is very little to the negligible degree.

Since the magnitude and direction of the detected current is determined by the result of detection of the balance recovery current under magnetic re-balance condition, it will do if a detected value outputting circuit (10) measuring and outputting the balance recovery current is connected with at least one of the balance recovery coil (5) and balance recovery current controlling circuit (9).

The magnetic bridge type current sensor of the present invention is not limited to the current sensor in the above-mentioned example, but, in the present invention, the current sensor with the following structure and shape may be provided.

Figure 5:
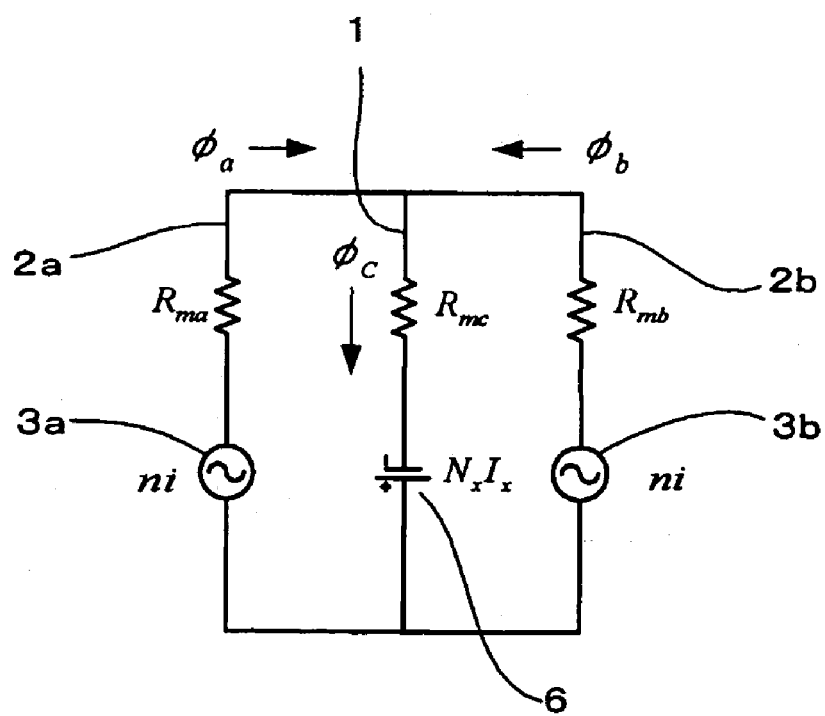
FIG. 5 shows an equivalent magnetic circuit when the detected current is running, in the current sensor of the present invention.
Figure 6:
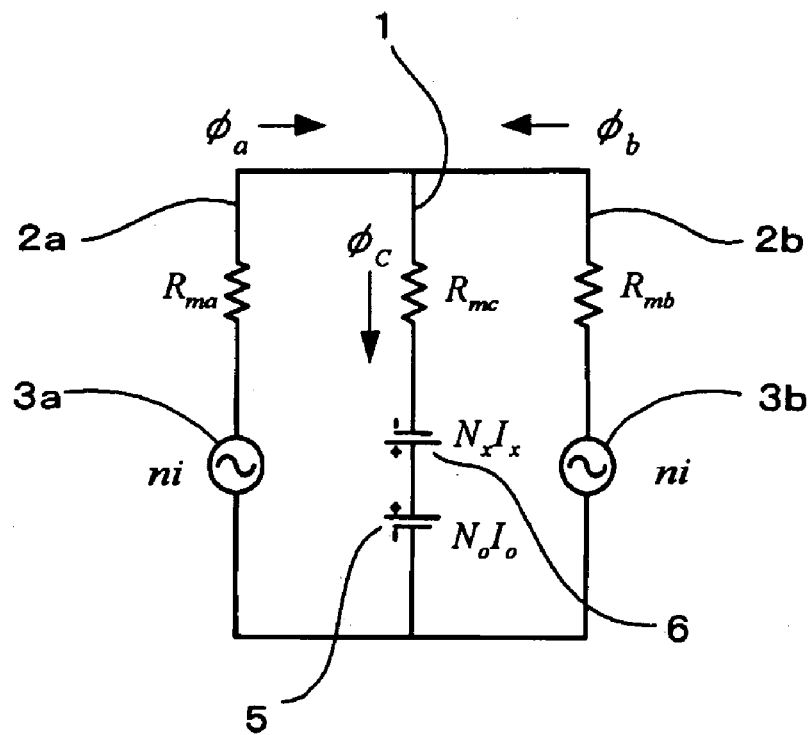
FIG. 6 shows an equivalent magnetic circuit when the detected current is running and the balance recovery current is running, in the current sensor of the present invention.
Figure 7:
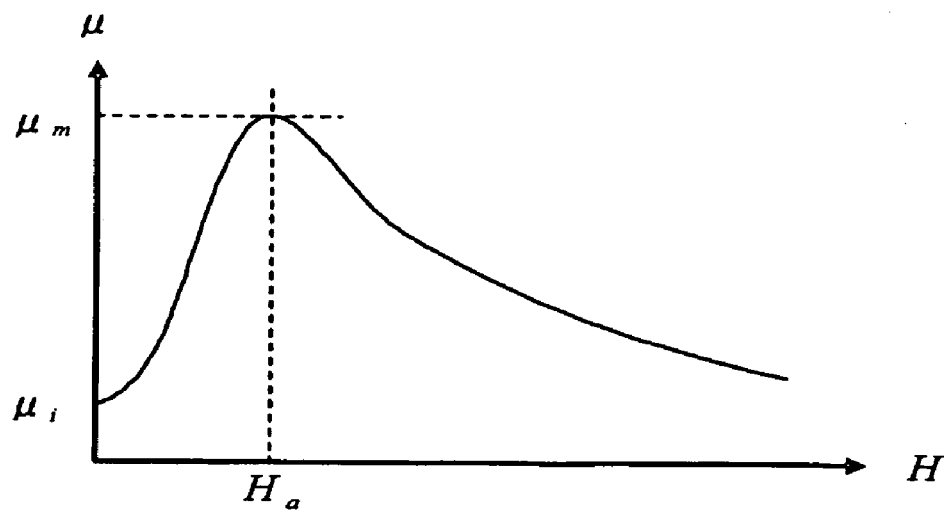
FIG. 7 is a characteristic graph of magnetic field to permeability in soft magnetic material.
Figure 8:
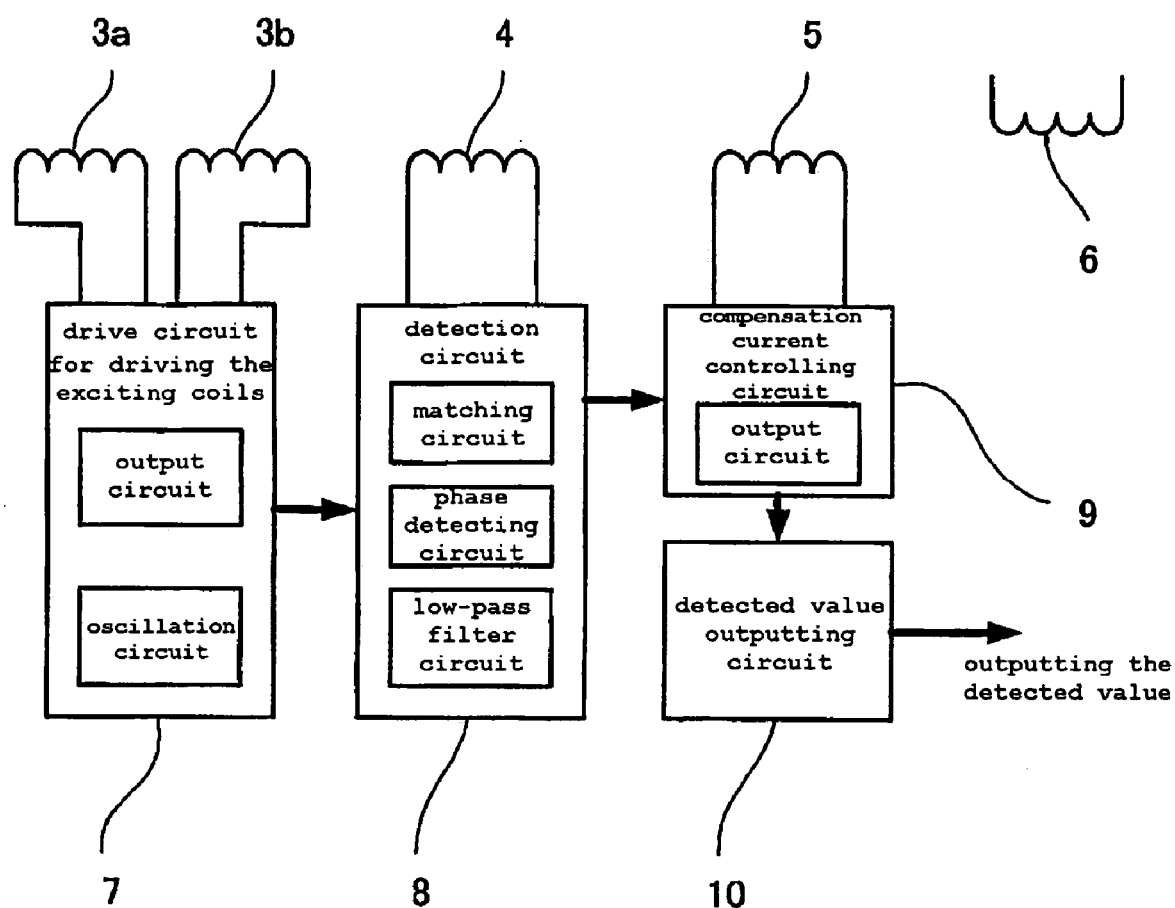
FIG. 8 is a block diagram of a circuit configuration in the current sensor of the present invention.

The equivalent circuit of the current sensor of the present invention with configuration illustrated above in FIG. 1 or FIG. 2 is shown in FIG. 5 or FIG. 6. The magnetic reluctance in the equivalent circuit of the current sensor of the present invention illustrated in FIG. 5 or FIG. 6 is represented as Rma1+Rma2=Rma, Rmb1+Rmb2=Rmb by the magnetic reluctance of the respective magnetic circuits in the equivalent circuit illustrated in FIG. 11.

Figure 11:
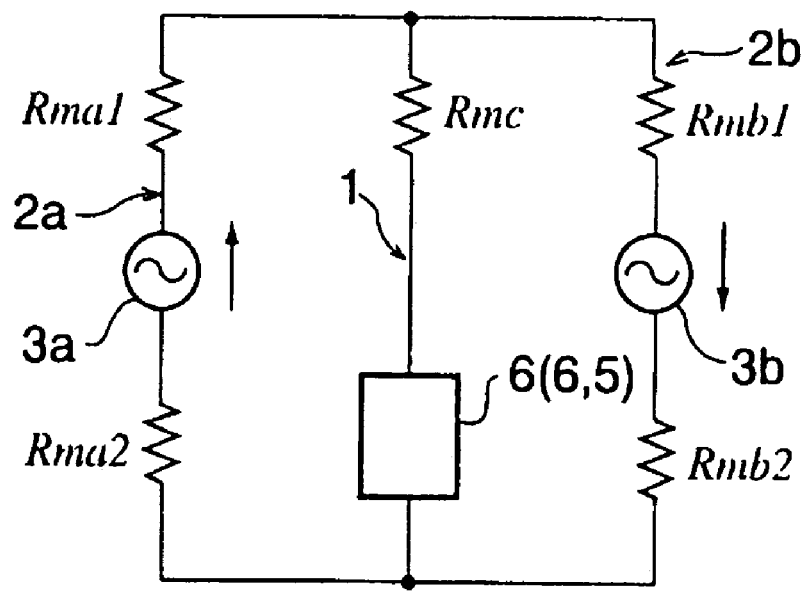
FIG. 11 shows a magnetic circuit equivalent to the equivalent magnetic circuit of the current sensor of the present invention in FIG. 5 or FIG. 6.

When the magnetomotive forces by two exciting means (3a,3b) have the same magnitude and the reverse direction and also the magnetic reluctances in two magnetic circuits (2a,2b) are the same, a condition for achieving the magnetic balance condition in FIG. 11, the magnetomotive force is represented as $ni_a = -ni_b$ and the magnetic reluctance is represented as Rma=Rmb. Also, Rma1=Rmb1, Rma2=Rmb2.

Figure 12:
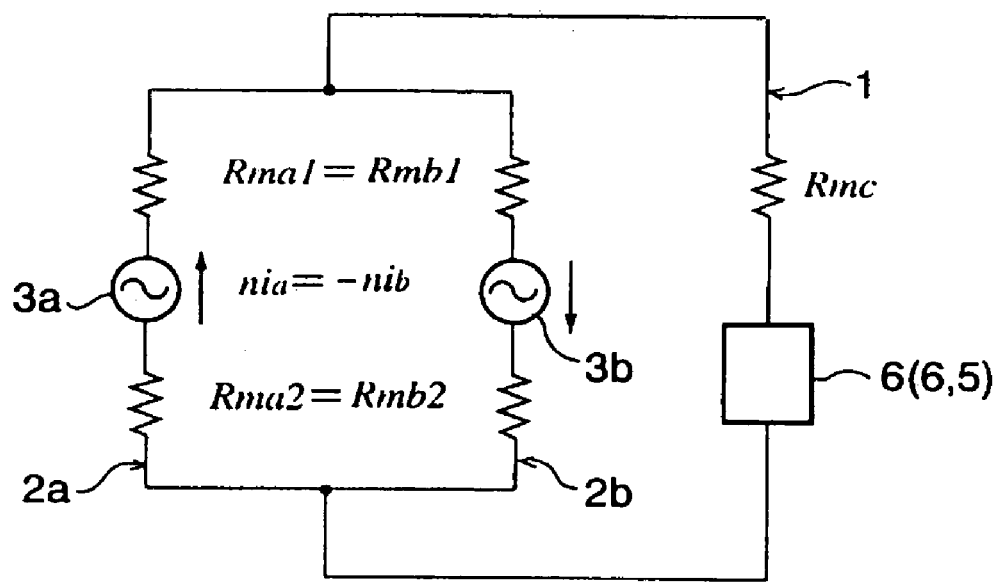
FIG. 12 shows a magnetic circuit equivalent to the equivalent magnetic circuit in FIG. 11.
Figure 13:
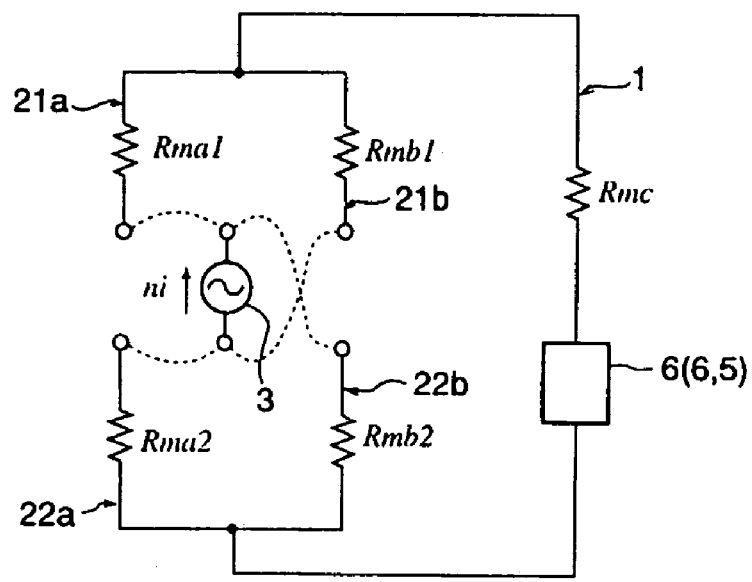
FIG. 13 shows a magnetic circuit equivalent to the equivalent magnetic circuit in FIG. 12.
Figure 14:
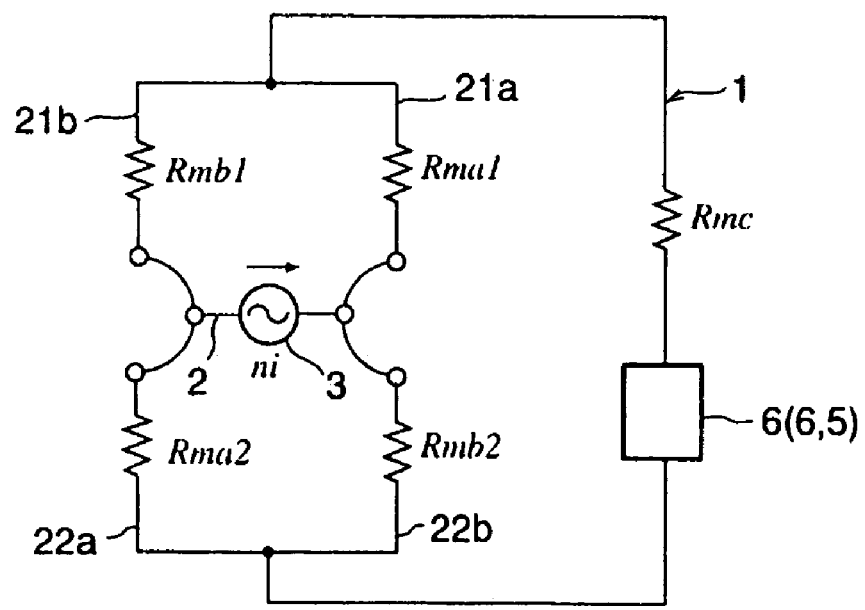
FIG. 14 shows a magnetic circuit equivalent to the equivalent magnetic circuit in FIG. 13.

Here, the equivalent circuit in FIG. 11 is the same as the equivalent circuit indicated in FIG. 12, which is as same as the equivalent circuit indicated in FIG. 13. Namely, for the convenience of description, the circuit in FIG. 13 has the configuration in which the magnetic circuits (2a,2b) are divided respectively into two magnetic circuits (21a,22a) and magnetic circuit (21b,22b), and one exciting means (3a) in FIG. 12 is inserted into the ends of the respective divided magnetic circuits. Further, the other exciting means (3b) is omitted by reversely connecting the exciting means (3a) with the magnetic circuits (21b,22b). Hereinafter, the exciting means in FIG. 13 is represented by the number (3). Since the equivalent circuit in FIG. 13 is represented as the equivalent circuit illustrated in FIG. 14, the current sensor of the present invention illustrated in FIG. 1, FIG. 2, FIG. 5 and FIG. 6 is also represented as the equivalent circuit indicated in FIG. 15, accordingly.

Figure 15:
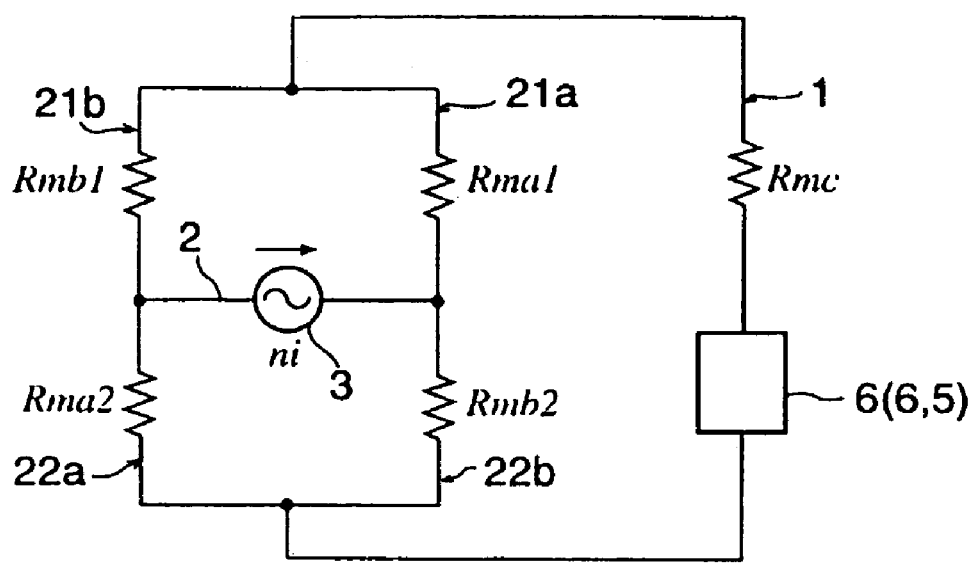
FIG. 15 shows a magnetic circuit equivalent to the equivalent magnetic circuit in FIG. 14.
Figure 16:
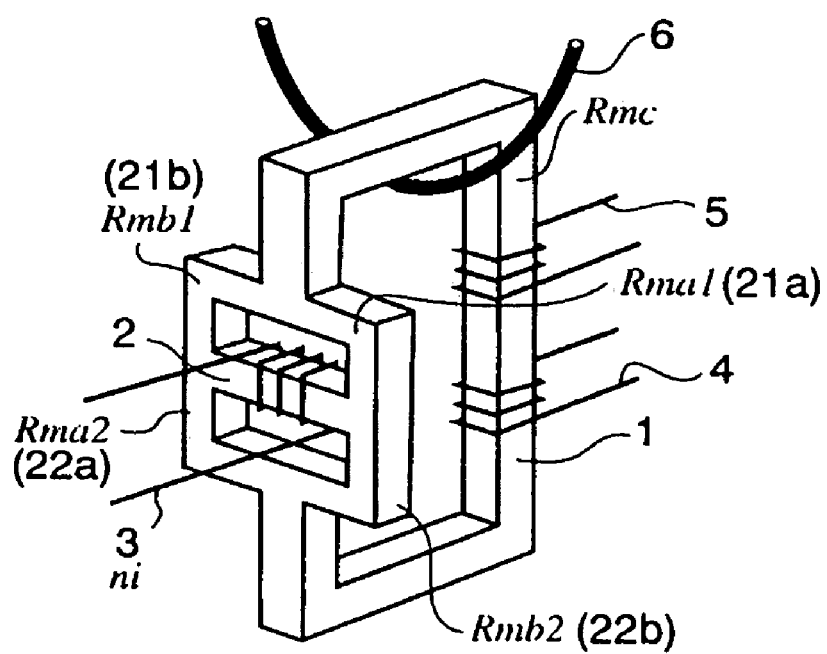
FIG. 16 is a perspective view of the main portion of the current sensor of the present invention that implements the equivalent magnetic circuit in FIG. 15.
Figure 17:
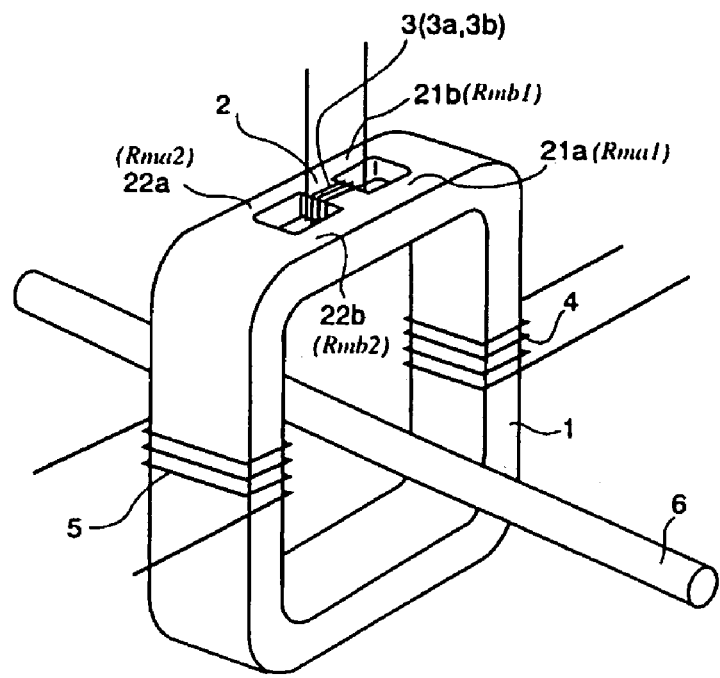
FIG. 17 is a perspective view of the main portion of a modification of the current sensor of the present invention in FIG. 16.

The equivalent circuit in FIG. 15 may have the shape, for example, indicated in FIG. 16 if it is schematically illustrated in the substantial shape like the current sensor of the present invention as indicated in FIG. 1 and FIG. 2. Also, the current sensor in FIG. 16 is represented in the shape of the current sensor illustrated in FIG. 17, when it is indicated more closely to the substantial shape. In FIG. 16 and FIG. 17, the members, the parts and the components as same as those in FIG. 1~FIG. 10 are represented by the same numbers.

In current sensors of the present invention as described in FIG. 1~FIG. 10, the magnetic balance condition is achieved by fine adjustment since two exciting means (3a,3b) are arranged in the right and left outer leg magnetic circuits (2a,2b), respectively, such that the magnetic balance, condition is affected by the magnetic characteristic difference between the right and left core material. However, in the current sensor with the shape in FIG. 17, the achievement of magnetic balance condition is facilitated since only one exciting means (3) will do such that there is no need for consideration of influence from the magnetic characteristic difference.

In this respect, the magnetic balance condition in current sensors of the present invention as described in FIG. 1~FIG. 10 comprises the condition relating to the magnetomotive force of two exciting means (3a,3b) and the condition relating to the magnetic reluctance of two magnetic circuits (2a,2b), and thus manufacturing is not easy since there are a lot of factors for the magnetic balance condition.

Figure 18:
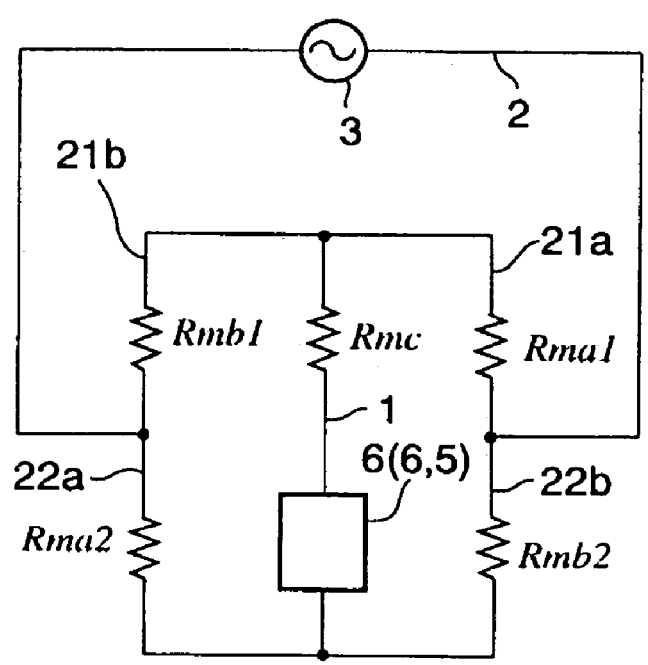
FIG. 18 shows a magnetic circuit equivalent to the equivalent magnetic circuit in FIG. 15.

However, four magnetic circuits (21a,22a,21b,22b) in current sensors of the present invention indicated in FIG. 15~FIG. 17, etc., can achieve the magnetic balance condition in which the flux by the exciting means (3) is not present in the magnetic circuit (1), if Rma1×Rma2=Rmb1×Rmb2 is satisfied, and thus, the manufacturing of magnetic circuits becomes easy since there is no need for the condition relating to the magnetomotive force of the exciting means (3). In this sense, the equivalent circuit of the current sensor of the present invention indicated in FIG. 15 may be represented as the equivalent circuit in FIG. 18 and the current sensor in the shape in FIG. 19 substantially illustrating the circuit in FIG. 18.

Next, referring to FIG. 20, it is possible to achieve the magnetic balance condition in the magnetic circuit (1) even if there is some deviation of the position in which the exciting coil (3) in FIG. 17 is arranged, and this aspect is described in the following.

Figure 20:
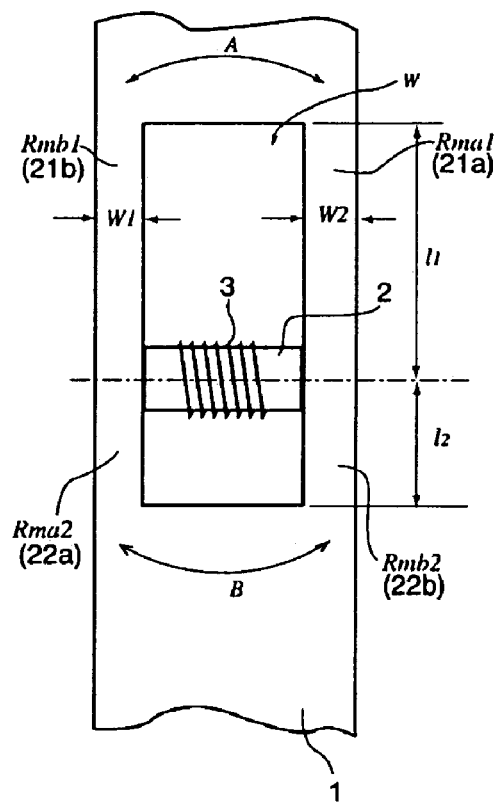
FIG. 20 is a enlarged plan of the main portion for the explanation of the position in the magnetic circuit (2), in which the exciting means in the current sensor of the present invention in FIG. 17 is arranged.

As indicated in FIG. 20, in the respective magnetic circuits (21a,22a,21b,22b) arranged to intersect across the magnetic circuit (2), Rmb1∝$l_1$/w1, Rma1∝$l_1$/w2 and Rmb2∝$l_2$/w2, Rma2∝$l_2$/w1 are satisfied, if the magnetic reluctance in the parts (A,B) of the core material is negligibly low.

Herein, w1, w2 are the width of core material remaining in the right and left of the core material by the window (W) arranged to be passed through the core material, and $l_1$, $l_2$ are the width formed by internal division of the window (W) in vertical direction by the arranged position of the magnetic circuit (2).

Since the magnetic reluctances of the respective magnetic circuits (21a,21b,22a,22b) in the magnetic balance condition of magnetic bridge satisfy Rma1×Rma2=Rmb1×Rmb2, the equation relating to the magnetic reluctances of the respective magnetic circuits (21a,21b,22a,22b) achieving the magnetic balance condition in the magnetic bridge is represented using the above proportional expression as ($l_1$/w2)×($l_2$/w1)=($l_1$/w1)×($l_2$/w2), namely, ($l_1$×$l_2$)/(w2×w1)= ($l_1$×$l_2$)/(w1×w2).

Where, $l_1$, $l_2$, w1, w2 are arbitrary values, the left side always equals to the right side, and any of $l_1$, $l_2$, w1, w2 is not zero. That is, the magnetic circuit (2) of the magnetic bridge in FIG. 20 is balanced since the total flux running into the magnetic circuit (1) becomes zero in any position of the window of the core material in FIG. 20. Further, substantially, it is preferred that the position of the magnetic circuit (2) is the position satisfying $l_1$=$l_2$(central point of the window (W) in vertical width) in FIG. 20, since the magnetic reluctance of the parts (A,B) in the core material is not zero such that it gives influence. However, even if there is some deviation in the position, the influence is very low since the magnetic reluctances of the parts (A,B) in the core material is very low relative to those of the magnetic circuits (21a,22a,21b,22b).

Figure 19:
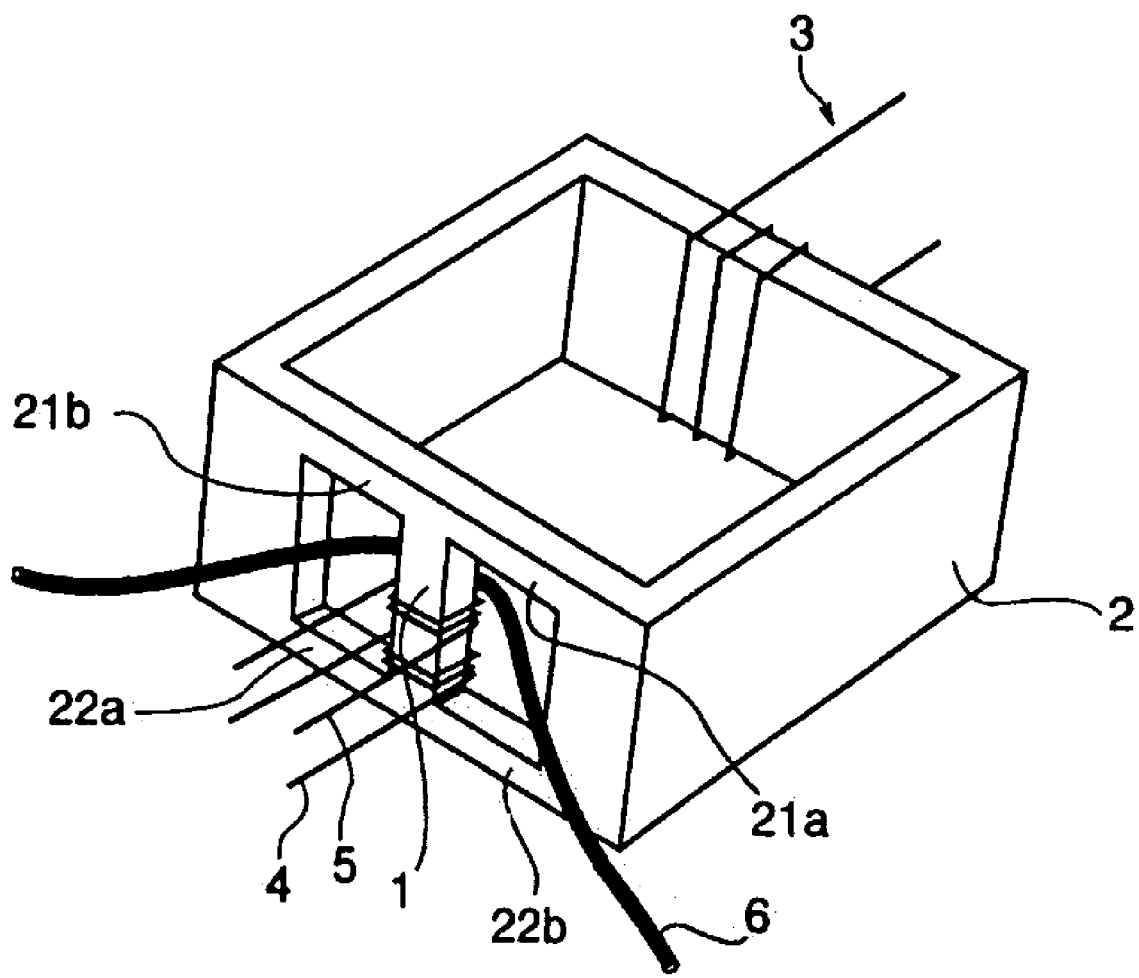
FIG. 19 is a perspective view of the current sensor of the present invention that implements the equivalent magnetic circuit in FIG. 18.
Figure 21:
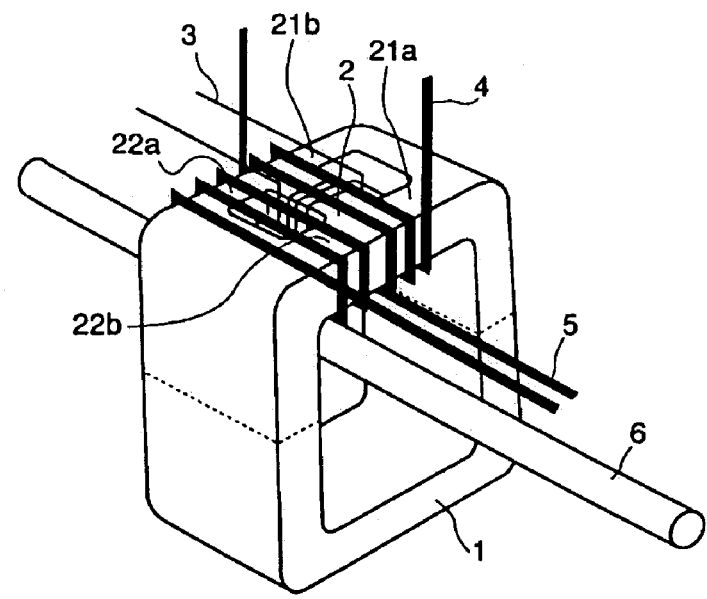
FIG. 21 is a perspective view for the explanation of an arrangement of the exciting coil and the balance recovery coil, in the current sensor of the present invention.

Next, in current sensors of the present invention illustrated in FIG. 17 or FIG. 19, etc., for the convenience of description and understanding, the flux detecting means (4) and the balance recovery coil (5) are arranged in the magnetic circuit (1). As for this arrangement, it is often preferred, as illustrated in FIG. 21, that the arrangement is close to the vicinity of magnetic bridge in which the respective magnetic circuits (21a,22a,21b,22b), the magnetic circuit (2) and the exciting means (3) are arranged, considering the convenience of manufacturing the current sensor of the present invention and using as the current detecting means. Also, the numbers used in FIG. 21, are used in the same sense as the same numbers used so far.

As described above, since the component of the concerned sensor is arranged in one side of the ring shaped core material to form the current sensor of the present invention such that the vicinity of the opposite semi-ring shaped side of the core material is formed to be removable from the part indicated by the dotted line or to be opened and closed in the shape of clamp, the current can be detected by, without cutting the previously arranged wire (the detected wire (6)), setting the current sensor of the present invention in the wire.

Figure 22:
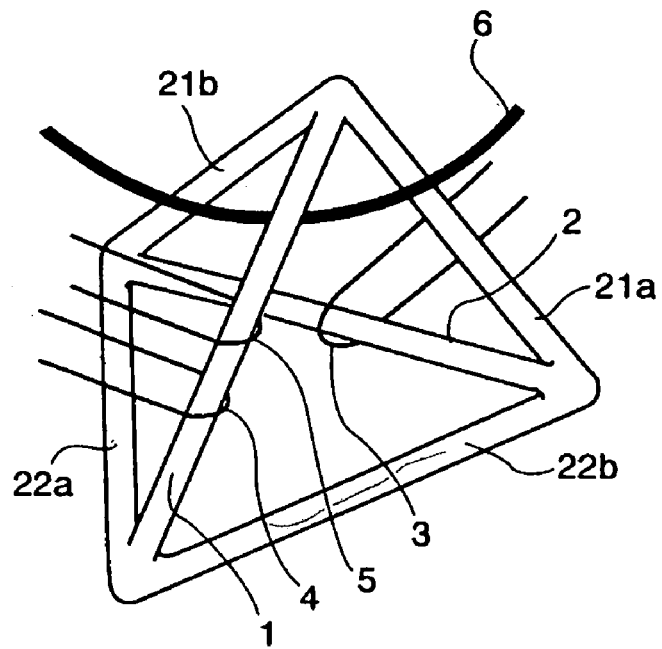
FIG. 22 is a perspective view of the current sensor of the present invention for the explanation of the conceptual principle.

Shortly, in the case that the exciting means (3) and the flux detecting means (4) in the current sensor of the present invention are coils, the exciting means (3) passing at least one time through both the window surrounded by the magnetic circuits (21a,21b,2) and the window surrounded by the magnetic circuits (22a,22b,2) will do, and also, the flux detecting means (4) passing at least one time through both the window surrounded by the magnetic circuits (21a, 22b,1) and the window surrounded by the magnetic circuits (22a,21b,1) will do. Therefore, the application of this configuration to the current sensor in claim 5 is embodied in FIG. 22, and this illustrates the fundamental configuration of the current sensor of the present invention. In FIG. 22, the same numbers used so far are used in the same sense.

From the above description, the configuration of the magnetic bridge type current sensor of the present invention and the current detecting method by this current sensor is derived as the following.

That is, the current sensor of the present invention with another configuration is characterized by comprising:

one magnetic circuit (1) having opposite ends;

magnetic circuits (21a,21b) having opposite ends, wherein the respective one ends of the magnetic circuits (21a,21b) are connected with one end of the magnetic circuit (1);

magnetic circuits (22b,22a) having opposite ends, wherein the respective one ends of the magnetic circuits (22b,22a) are connected with the other end of the magnetic circuit (1), and the other ends of the magnetic circuits (22b,22a) are connected with the magnetic circuits (21a, 21b), respectively;

one magnetic circuit (2) having opposite ends, wherein one and the other ends of the magnetic circuit (2) are connected with a contact between the magnetic circuits (21a,22b) and a contact between the magnetic circuits (21b,22a), respectively;

an exciting means (3) arranged to generate the flux along the magnetic circuit (2);

a flux detecting means (4) arranged to detect the flux of the magnetic circuit (1);

a drive means (7) for driving the exciting means (3); and a detection circuit (8) connected with the flux detecting means (4) and outputting the electric signals interlocked with the flux being detected by the flux detecting means (4).

Further, the current detecting method of the above current sensor is characterized by comprising:

achieving magnetic balance condition in which the flux by an exciting means (3) is not present in a magnetic circuit (1), by properly selecting the magnetic reluctance of magnetic circuits (21a,21b,22a,22b) to equalize magnetic potential of the opposite ends of the magnetic circuit (1);

achieving magnetic non-balance condition due to collapse of the magnetic balance condition, which is caused by running detected current along a detected wire (6) passed through at least one of the window surrounded by the magnetic circuits (21a,22b,1) and the window surrounded by the magnetic circuits (21b,22a,1) to vary the magnetic reluctance of at least one of the magnetic circuits (21a,22a, 21b,22b); and detecting the detected current running along the detected wire (6) by detecting the flux which is generated along the magnetic circuit (1) through achieving the magnetic non-balance condition, by a detection circuit (8) outputting the electric signals interlocked with the flux being detected by a flux detecting means (4).

Instead of the above method, the method characterized by comprising the following may be used:

achieving magnetic re-balance condition by running balance recovery current along a balance recovery coil (5) to return, to the magnetic reluctance prior to variation, the varied magnetic reluctance of the magnetic circuit of which the magnetic reluctance is varied, and thus, decrease the flux being generated along a magnetic circuit (1) in the condition that the magnetic reluctance of at least one of magnetic circuits (21*a*,22*a*,21*b*,22*b*) is varied, wherein the balance recovery current, which generates the flux of which the magnitude is as same as that of the flux being generated along the magnetic circuit around which a detected wire (6) is wound by being passed therethrough in the condition that the magnetic reluctance of at least one of the magnetic circuit (21*a*,22*a*,21*b*,22*b*) is varied and the direction is reverse to that of the said flux, is run along the balance recovery coil (5) which is wound by being passed through the same window as the window through which the detected wire (6) is passed; and detecting the detected current running along the detected wire (6) by detecting the balance recovery current running along the balance recovery coil (5) in the magnetic re-balance condition.

The magnetic bridge used in the current detecting method of the present invention has basic magnetic detection ability, since the present invention described above is capable of detecting current by detecting magnetic field generated around the current due to the current. As described previously, the current sensor and current detecting method enables the detection of very small current, with high sensitivity and high precision, and this ability is largely due to the magnetic detection ability of the magnetic bridge.

In this aspect, since the magnetic bridge used in the current sensor of the present invention can be used as a component in the magnetic sensor and magnetic detection method, the embodiment relating to the magnetic sensor and magnetic detection method completed using the magnetic bridge is described referring to FIG. 23~FIG. 29.

The core material of the magnetic bridge in the current sensor of the present invention previously described is formed as loop shaped closed core, since there is need for efficient capturing of the flux by the detected current that is present in loop shape in the magnetic bridge when current is detected. However, to enable the magnetic bridge to exert its capability as a magnetic sensor, there is need for efficient receiving of the flux in space by forming the part of core capturing the flux to be open. The embodiment of the magnetic sensor using the magnetic bridge formed to satisfy this requirement is illustrated in FIG. 23 and FIG. 24.

Figure 23:
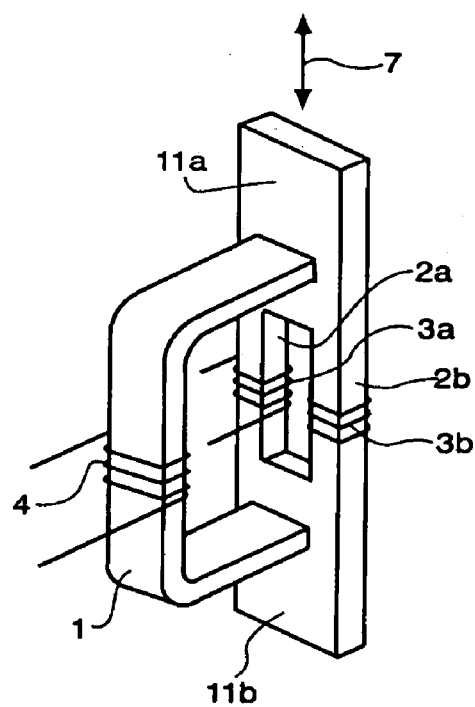
FIG. 23 is a perspective view of the magnetic sensor of the present invention in the first embodiment using the magnetic bridge of the present invention with two exciting means (exciting coils;3)
Figure 24:
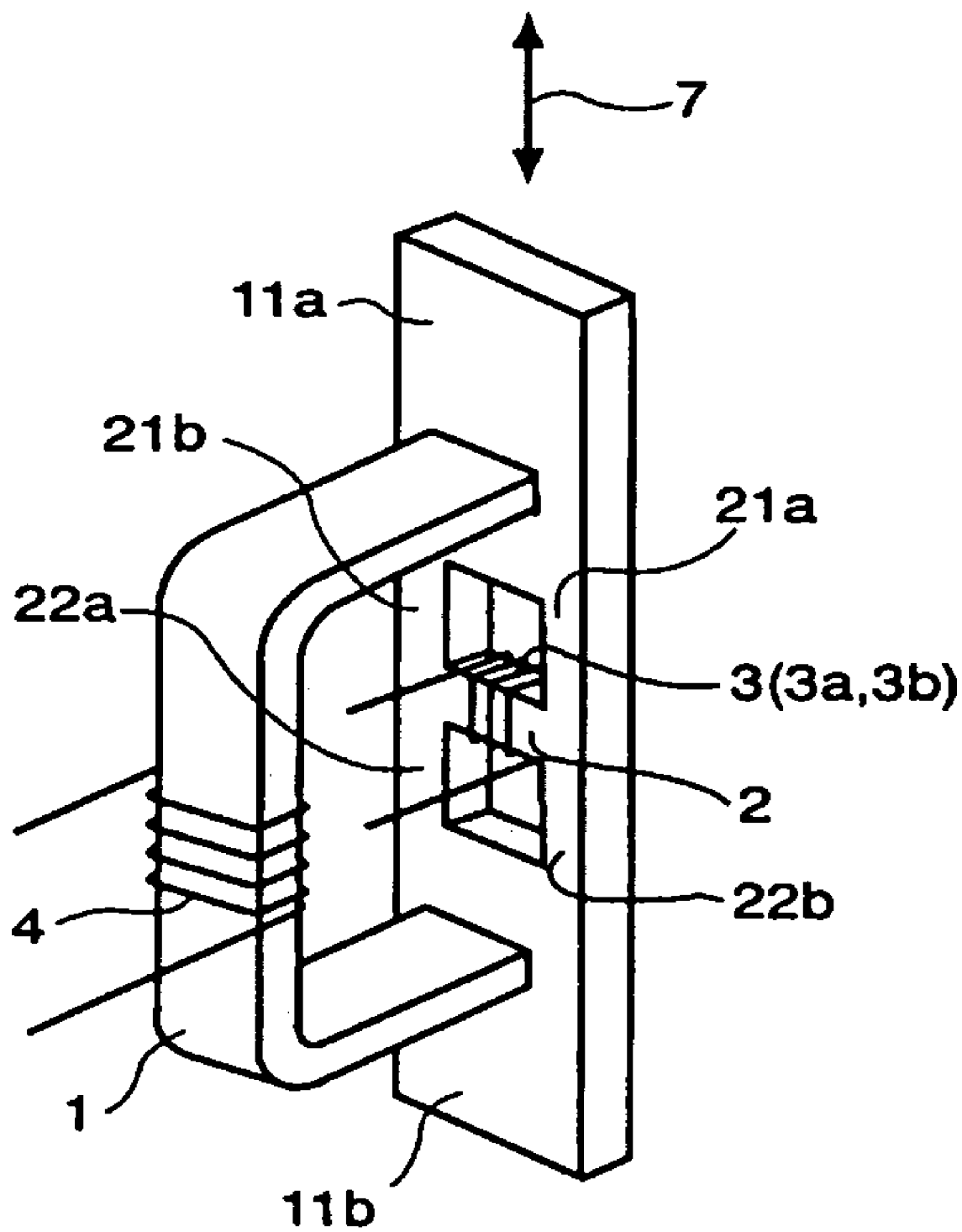
FIG. 24 is a perspective view of the magnetic sensor of the present invention in the second embodiment using the magnetic bridge of the present invention with one exciting means (exciting coil;3)

In FIG. 23, there is a magnetic sensor with two exciting coils (3*a*,3*b*) and, in FIG. 24, there is a magnetic sensor with one exciting coil (3). These are corresponding to the current sensor of the present invention in FIG. 1 and FIG. 16, respectively. But, the detected wire (6) is not required since the configuration in FIG. 23 and FIG. 24 is for magnetic sensors, and also the balance recovery coil (5) in FIG. 1 and FIG. 16 is omitted. Further, in the above magnetic sensor, the balance recovery coil (5) may be employed and may not be employed. However, in both cases, it functions as a magnetic sensor. In the case that the balance recovery coil (5) is employed, dynamic range of detection becomes wider and its precision becomes better.

In the following, the magnetic sensor with one exciting coil (3) as indicated in FIG. 24 is described as representative of magnetic sensor and magnetic detection method in the present invention.

The magnetic sensor in FIG. 24 is capable of detecting the magnetic field magnetically working on the magnetic sensor or the magnitude and direction of the flux passing through the magnetic sensor.

This is possible since the magnetic sensor use the magnetic detection function of the magnetic bridge used in current sensor and current detecting method of the present invention previously described. Namely, in the previous current sensor and current detecting method of the present invention, the flux along the magnetic circuit around the detected wire is generated by the minute magnetic field generated due to current running along the detected wire and the concerned flux is detected in the part of magnetic bridge. The flux detectable in the part of magnetic bridge is not limited to the flux generated by the current along the detected wire, but the same effect as current detection in the magnetic bridge is made even if the flux is other imported flux or magnetic field.

The magnetic bridge of the magnetic sensor illustrated in FIG. 24 is formed in the configuration where a magnetic introduction member (11*a*) and a magnetic introduction member (11*b*) protrude the junction of a magnetic circuit (1) and magnetic circuits (21*a*,21*b*) upwardly and the junction of the magnetic circuit (1) and magnetic circuits (22*a*,22*b*) downwardly, respectively. That is, the magnetic introduction members (11*a*,11*b*) is formed to become the magnetic circuits for easily introducing the detected magnetic field into the magnetic bridge. In the following, the magnetic introduction members (11*a*,11*b*) are often represented as magnetic circuits (11*a*,11*b*). This is similar to the magnetic bridge illustrated in FIG. 23.

In the case that the imported magnetic field into the magnetic bridge is not present, and the magnetic bridge is under magnetic balance, the flux by the exciting means (the exciting coil in FIG. 24; 3) is not passed through the magnetic circuit (1) and not through the detecting coil (4). Accordingly, electromotive force is not generated across the detecting coil (4).

However, if the magnetic sensor in FIG. 24 is exposed to the flux with the component of which the direction is as same as that of the flux indicated by the number (7) in FIG. 24, flux is generated along the magnetic circuit (11*a*) and magnetic circuit (11*b*) which are the magnetic introduction members and along the magnetic circuits (21*a*,22*a* and 21*b*,22*b*) connecting both the magnetic circuits (11*a*,11*b*). Namely, the flux by the detected magnetic field gets to pass through the magnetic bridge in the magnetic sensor. As a result, the balance in this magnetic bridge is broken by the concerned flux passing through the magnetic bridge and the flux by the exciting means (the exciting coil; 3) leaks to pass through the magnetic circuit (1).

In this case, electromotive force is generated across the detecting coil (4) since the flux by the exciting means (the exciting coil; 3) is an alternating flux such that the flux passing through the magnetic circuit (1) becomes alternating flux. At this time, the flux passing through the magnetic circuit (1) includes much the component of double frequency relative to the excitation frequency of the exciting means (the exciting coil; 3) similarly to the current sensor of the present invention previously described.

The electromotive force generated across the detecting coil (4) is proportional to the intensity of flux passing through the magnetic circuit (1), and the intensity of flux passing through the magnetic circuit (1) is proportional to the intensity of flux leaking from the magnetic bridge. Further, the intensity of flux leaking from the magnetic bridge is proportional to the intensity of the detected magnetic field. That is, the electromotive force proportional to the intensity of the detected magnetic field is obtained from the detecting coil (4). In this way, the above magnetic sensor is capable of detecting the intensity of magnetic field in space where the magnetic sensor is placed, by detecting the electromotive force across the detecting coil (4). Here, the electromotive force generated across the detecting coil (4) is phase inverted according to the direction of the detected magnetic field, on the basis of the magnetomotive force of the exciting means (the exciting coil; 3). As a result, it is understood that this magnetic sensor is also capable of detecting the direction of magnetic field besides the intensity of magnetic field.

Among the above magnetic sensors, the sensitivity of sensor in which the flux by the detected magnetic field efficiently passes through the magnetic bridge in the magnetic sensor is better. And, when the detected magnetic field passes through magnetic paths connecting the magnetic introduction members (11a,11b), there are two magnetic paths. That is, one path passes through the magnetic bridge and the other path passes through the magnetic circuit (1). In this case, only the flux passing through the magnetic bridge contributes directly to magnetic detection. Therefore, it is preferred that more flux is passed through the magnetic bridge. In other words, it is preferred that the flux by the detected magnetic field, passing through the magnetic circuit (1), is as small as possible.

Figure 25:
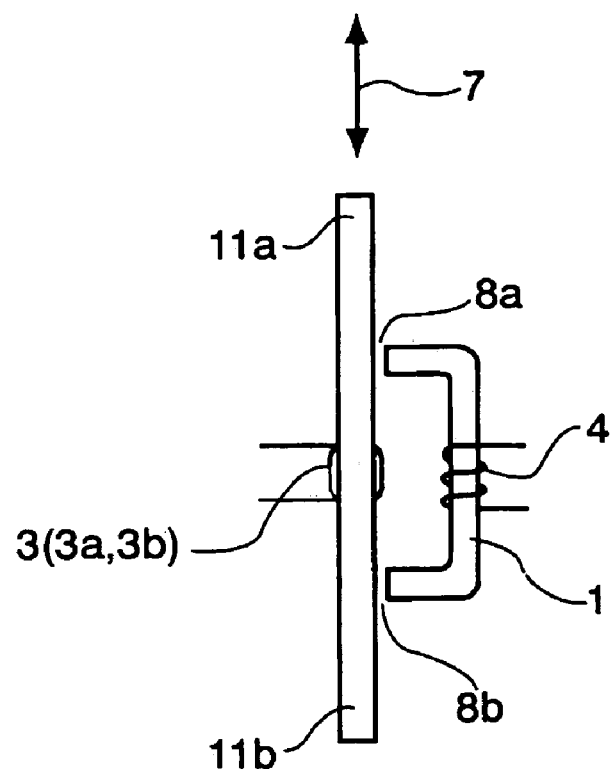
FIG. 25 is a side view of the magnetic sensor of the present invention with magnetic gaps.

To achieve this, it is preferred that the magnetic reluctance of magnetic circuit (1) becomes larger than the magnetic reluctance of magnetic bridge. Specifically, as a method, magnetic gaps (8a,8b) are arranged in the junction of the magnetic bridge, the magnetic introduction members (11a, 11b) and the magnetic circuit (1), as indicated in FIG. 25. At this time, the position and the number of the magnetic gaps (8a,8b) are not limited to these indicated in FIG. 25, but any position in the magnetic circuit (1) and any number of the gaps will do only if the above object is accomplished.

In addition, the above magnetic gaps (8a,8b) are obstacles to the flux by the exciting means (the exciting coil; 3), passing through the magnetic circuit (1), and, relating to the magnetic path of flux by the exciting means (the exciting coil; 3), leaking from the magnetic bridge, most of the leaking flux is passed through the magnetic circuit (1) since the magnetic reluctance in the path from the magnetic gaps (8a,8b) to the magnetic circuit (1) is the least. Due to this, it is possible to manufacture, as wished, the magnetic sensor having various sensitivity together with the intensity of detected magnetic field to detect, by properly adjusting the magnetic gaps (8a,8b) indicated in FIG. 25.

Figure 28:
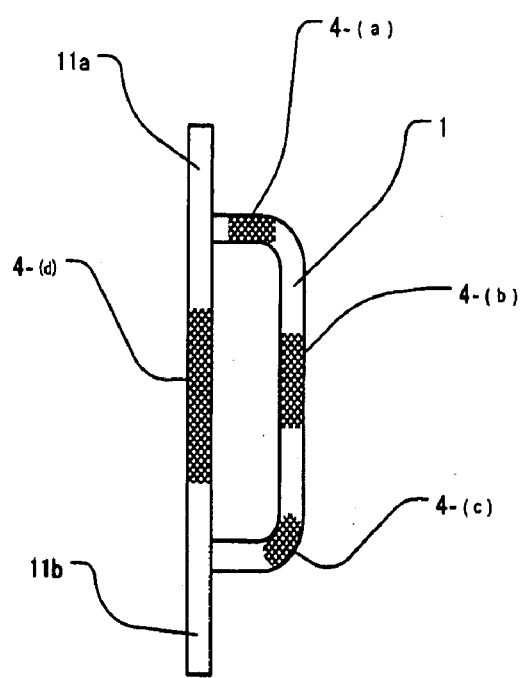
FIG. 28 is a schematic of an arrangement of the flux detecting means (4)

While the flux detecting means (4) all arranged in the magnetic circuit (1) has been described so far in the description of the magnetic sensor, the flux detecting means (4) may also be arranged in the magnetic bridge as well as in the magnetic circuit (1), as described in the current sensor. The embodiment is schematically illustrated in FIG. 28. Namely, the flux detecting means (4) may be arranged in any position of 4- (*a*), 4- (*b*), 4- (*c*), 4- (*d*), etc. indicated in FIG. 28.

In the current sensor of the present invention previously described, the magnetic circuit (1) is required to pass the excited flux leaking from the magnetic bridge therethrough and also efficiently capture the flux by the detected current.

However, there is no need for the capability to efficiently capture the flux in the magnetic circuit (1) in the magnetic sensor. That capability depends on the magnetic circuits (11a,11b). In the case that there is the magnetic circuit (1) in the above magnetic sensor, it only functions to pass the excited flux leaking from the magnetic bridge therethrough.

Accordingly, in the case that the flux detecting means (4) is arranged in the concerned magnetic circuit (1), the magnetic circuit (1) is necessarily in substantial shape, however, in the case that the flux detecting means (4) is arranged in the magnetic bridge, the magnetic circuit (1) is not necessarily in substantial shape. The reason is described in the following.

That is, in the magnetic sensors in FIG. 23 and FIG. 24, the magnetic circuit (1) is described to be formed of magnetic material. However, if the magnetic circuit (1) is considered to be formed of non-magnetic material (vacuum, air, plastic, water, oil, etc.), there is no need for the magnetic circuit (1) to be in substantial shape.

This is considered as follows. Namely, if the magnetic gaps (8a,8b) arranged in the magnetic circuit (1) indicated in FIG. 25 gradually grow larger, finally, the entire magnetic circuit (1) becomes the magnetic gap.

Figure 29:
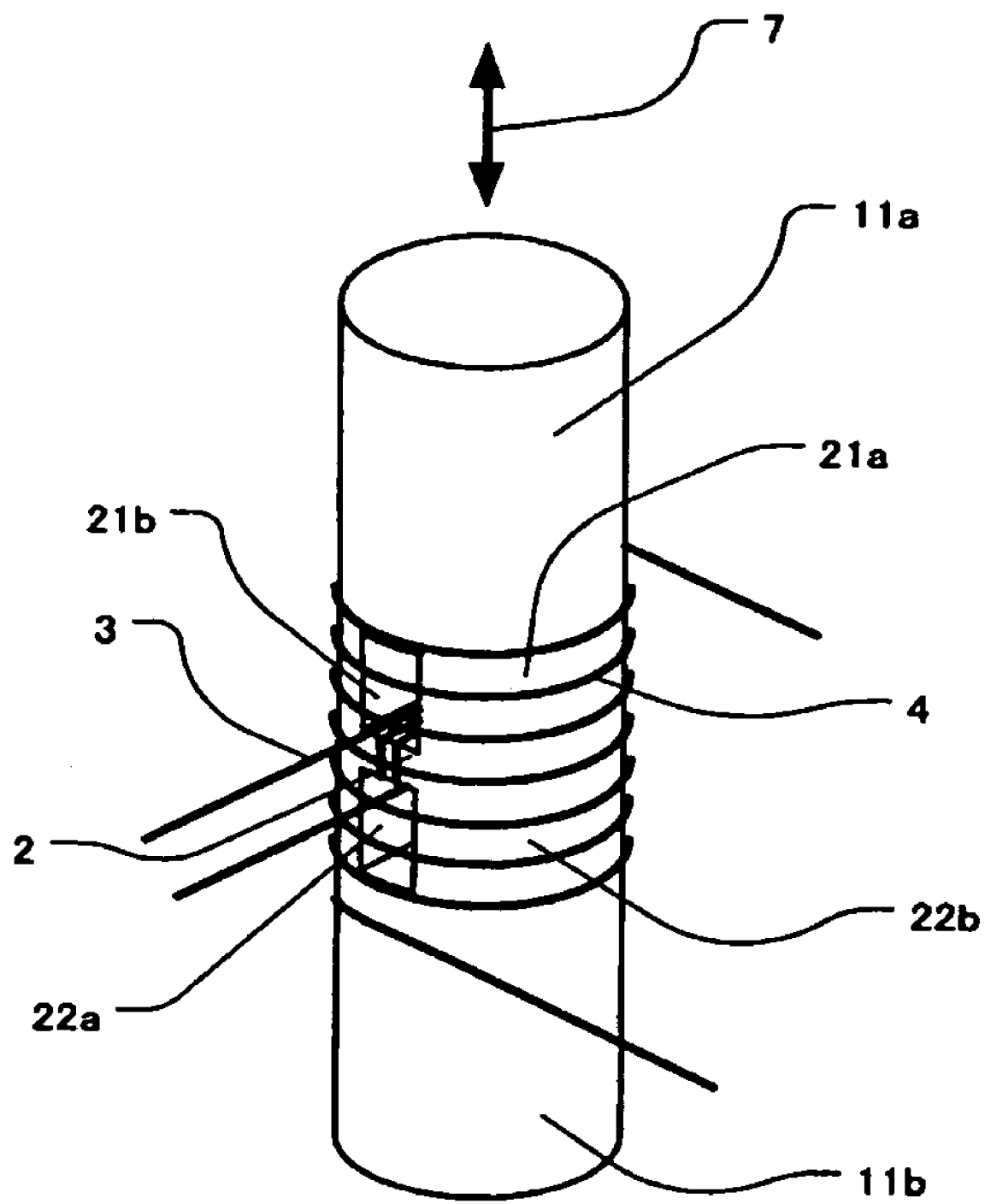
FIG. 29 is a perspective view of the magnetic sensor in which the magnetic circuit (1) is formed of non-magnetic material such as air, etc.

Based on the above consideration, the embodiment in which the magnetic circuit (1) is formed of non-magnetic material (not in substantial shape) and there is one exciting means (3) is illustrated in FIG. 29. In the case that there are two exciting means (3a,3b), the same configuration may be made.

The magnetic sensor provided with the above magnetic circuit (1) in no substantial shape is useful for manufacturing of micro magnetic sensor. For example, even a sensor with length 2.0 mm×width 1.6 mm×thickness 1.0 mm is easily manufactured. If the magnetic sensor gets to be smaller as such, the distance between the opposite ends of the magnetic bridge gets to be closer and so it may be considered that the wider magnetic gap is formed.

Figure 26:
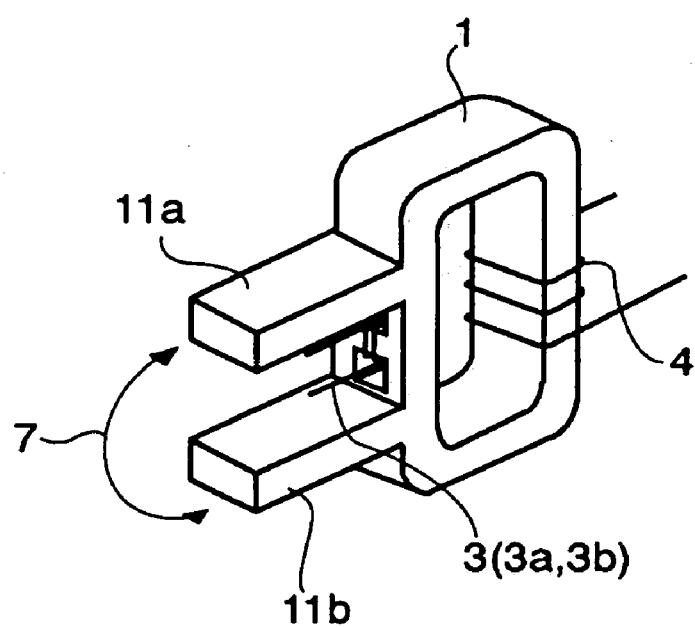
FIG. 26 is a perspective view of the magnetic sensor of the present invention of which the shape is suitable for detecting magnetism of adjacent dipole.
Figure 27:
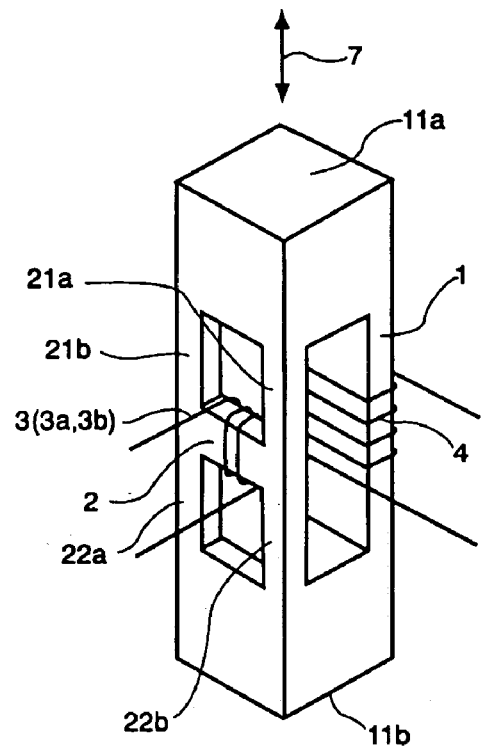
FIG. 27 is a perspective view of the magnetic sensor of the present invention that is suitable for miniaturization.

The structures of magnetic sensors described above are suitable in the case where the line of magnetic force of the detected magnetic field is relatively linear in shape or the case where the detection of the magnetic field radiating from any one of N pole and S pole is carried out. However, there is the case where the detection of the magnetic field from both N pole and S pole adjacent to each other is required. The embodiment of magnetic sensor suitable for this case is illustrated in FIG. 26. In the magnetic sensor of FIG. 26, the magnetic introduction members (11a,11b) is formed in the shape corresponding to both magnetic poles adjacent to each other. Besides, the different configuration of magnetic sensor using the magnetic bridge of the present invention may be employed according to various uses, and, for example, in the case that the shape of magnetic sensor is preferred to be slim or to be slim and with no protrusion, the configuration in FIG. 27 may be employed. The magnetic introduction members (11a,11b) (magnetic circuits (11a,11b)) in the above magnetic sensor are not formed by definite boundary, and thus, they may be the junction of the outer leg magnetic circuits (2a,2b) and the middle leg magnetic circuit (1), the junction of the magnetic circuits (21a,21b) and the magnetic circuit (1) or the junction of the magnetic circuits (22a,22b) and the magnetic circuit (1), that is, the magnetic circuits (11a,11b) is considered to be junctions of the magnetic circuits, as understood from the embodiment of magnetic sensor in FIG. 27. This is similar to the embodiment of magnetic sensor in FIG. 29. In addition, the numbers in FIG. 26~FIG. 29 are used in the same sense as the numbers in FIG. 23~FIG. 25.

As disclosed from the above, operation of the magnetic bridges in the above magnetic sensors is as same as the magnetic bridges in the current sensors of the present invention previously described. Therefore, the detection of magnetic field, with higher precision, is also possible if, similarly to the current sensors of the present invention, the balance recovery coil (not shown) is arranged in the magnetic sensors such that the magnetic re-balance condition is achieved.

Based on the above description, the magnetic sensor using the magnetic bridge of the present invention is specified as the first magnetic sensor characterized by comprising:

one magnetic circuit (1) having opposite ends;

two magnetic circuits (2a,2b) joined with one and the other ends of the magnetic circuit (1), respectively, and also having magnetic circuits (11a,11b) of the magnetic introduction members protruding the respective junctions outwardly;

an exciting means (3a) arranged in the magnetic circuit (2a) and an exciting means (3b) arranged in the magnetic circuit (2b);

a flux detecting means (4) arranged in the magnetic circuit (1);

drive means (7) for driving the exciting means (3a) and the exciting means (3b), respectively; and a detection circuit (8) connected with the flux detecting means (4) and outputting the electric signals interlocked with the flux being detected by the flux detecting means (4).

Further, the first magnetic sensor may comprise:

a balance recovery coil (5) arranged by winding a wire around at least one of the magnetic circuit (1) and the magnetic circuits (2a,2b);

a balance recovery current controlling circuit (9) for controlling the balance recovery current run along the balance recovery coil (5) to decrease the flux being detected by the flux detecting means (4), based on the electric signals being output from the detection circuit (8); and a detected value outputting circuit (10) for outputting the balance recovery current value.

The second magnetic sensor is characterized by comprising:

a magnetic circuit (1) having opposite ends;

magnetic circuits (21a,21b) having opposite ends, wherein the respective one ends of the magnetic circuits (21a,21b) are connected with one end of the magnetic circuit (1);

magnetic circuits (22b,22a) having opposite ends, wherein the respective one ends of the magnetic circuits (22b,22a) are connected with the other end of the magnetic circuit (1), and the other ends of the magnetic circuits (22b,22a) are connected with the magnetic circuits (21a, 21b), respectively;

magnetic circuits (11a,11b) of magnetic introduction members protruding the junction of the magnetic circuits (21a,21b) and the magnetic circuit (1) and the junction of the magnetic circuits (22b,22a) and the magnetic circuit (1) outwardly, respectively;

one magnetic circuit (2) having opposite ends, wherein one and the other ends of the magnetic circuit (2) are connected with a contact between the magnetic circuits (21a,22b) and a contact between the magnetic circuits (21b,22a), respectively;

an exciting means (3) arranged to generate the flux along the magnetic circuit (2);

a flux detecting means (4) arranged to detect the flux passing through the magnetic circuit (1);

a drive means (7) for driving the exciting means (3); and a detection circuit (8) connected with the flux detecting means (4) and outputting the electric signals interlocked with the flux being detected by the flux detecting means (4).

A magnetic detection method used in the first magnetic sensor is characterized by comprising:

achieving magnetic non-balance condition due to collapse of magnetic balance condition, which is caused by exposing core material forming the respective magnetic circuits to magnetic field, under the magnetic balance condition achieved by generating the first excited flux, which is an alternating flux, to run along a middle leg magnetic circuit (1) by an exciting means (3a) and generating the second excited flux, of which the magnitude is as same as that of the first excited flux and the direction is reverse to that of the first excited flux, which is an alternating flux to run along the middle leg magnetic circuit (1) by an exciting means (3b); and detecting the detected magnetic field of the above magnetic field from the flux passing through the magnetic circuit (1) through achieving the magnetic non-balance condition, by a detection circuit (8) outputting the electric signals interlocked with the flux being detected by a flux detecting means (4).

Another magnetic detection method used in the first magnetic sensor is characterized by comprising:

achieving magnetic non-balance condition due to collapse of magnetic balance condition, which is caused by exposing core material forming the respective magnetic circuits to magnetic field, under the magnetic balance condition achieved by generating the first excited flux, which is an alternating flux, to run along magnetic circuits (11a,11b) by an exciting means (3a) and generating the second excited flux, of which the magnitude is as same as that of the first excited flux and the direction is reverse to that of the first excited flux, which is an alternating flux to run along the magnetic circuits (11a,11b) by an exciting means (3b); and detecting the detected magnetic field of the above magnetic field through achieving the magnetic non-balance condition, by a detection circuit (8) outputting the electric signals interlocked with the flux being detected by a flux detecting means (4).

Also, in the second magnetic sensor, the magnetic detection method characterized by comprising the following may be employed:

achieving magnetic non-balance condition due to collapse of magnetic balance condition, which is caused by exposing core material forming the respective magnetic circuits to magnetic field to vary the magnetic reluctance of at least one of magnetic circuits (21a,22a,21b,22b), under the magnetic balance condition, in which the flux by an exciting means (3) is not present in a magnetic circuit (1), achieved by properly selecting the magnetic reluctance of magnetic circuits (21a, 21b,22a,22b) to equalize magnetic potential of the opposite ends of the magnetic circuit (1); and detecting the detected magnetic field of the above magnetic field by detecting the flux which is generated along the magnetic circuit (1) through achieving the magnetic non-balance condition, by a detection circuit (8) outputting the electric signals interlocked with the flux being detected by a flux detecting means (4).

Also, the magnetic detection method characterized by the following may be employed:

magnetic circuits (21a,21b) having opposite ends, wherein one ends of the magnetic circuits (21a,21b) are connected;

magnetic circuits (22b,22a) having opposite ends, wherein one ends of the magnetic circuits (22b,22a) are connected, and the other ends of the magnetic circuits (22b,22a) are connected with the magnetic circuits (21a, 21b), respectively;

one magnetic circuit (2) having opposite ends, wherein one and the other ends of the magnetic circuit (2) are connected with a contact between the magnetic circuits (21a,22b) and a contact between the magnetic circuits (21b,22a), respectively;

an exciting means (3) arranged to generate the flux along the magnetic circuit (2); and a drive means (7) for driving the exciting means (3); are provided, wherein, achieving magnetic non-balance condition due to collapse of magnetic balance condition, which is caused by exposing core material forming the respective magnetic circuits to magnetic field to vary the magnetic reluctance of at least one of magnetic circuits (21a,22a,21b,22b), under the magnetic balance condition, in which magnetic potential of the contact between the magnetic circuits (21a,21b) and the contact between the magnetic circuits (22b,22a) is equalized, achieved by properly selecting the magnetic reluctance of the magnetic circuits (21a,21b,22a,22b), and detecting the detected magnetic field of the above magnetic field by detecting the flux which is generated by the magnetic potential difference generated between the above contacts through achieving the magnetic non-balance condition, by a detection circuit (8) outputting the electric signals interlocked with the flux being detected by a flux detecting means (4).

Now, the difference in effect between the magnetic sensor using magnetic bridge of the present invention and the magnetic sensor of the prior art is described.

Typically, the magnetic sensors of the prior art are classified into semiconductor magnetic sensor (magnetic reluctance element•hall element•hall IC), diamagnetic substance sensor (ferromagnetic thin film element•magnetic impedance element), coil pickup sensor (flux gate magnetometer), and the others.

The semiconductor magnetic sensor is suitable for detection of strong magnetic field, but it is dull at sensitivity of about $10^{-2}$G and the non-uniformity among elements is also large since the temperature characteristic is bad.

In diamagnetic substance sensor, special material with sensitivity of $10^{-6}$G is used and the cost is expensive since the advanced manufacturing technique or facilities are required.

The coil pickup sensor is for detecting the variation of flux from the electromotive force generated across a coil, however, the detection of static magnetic field (direct current magnetic field) is impossible by only winding a coil around a core. To resolve this problem, the flux gate magnetometer was contrived, in which the sensitivity is about $10^{-6}$G similar to that of the diamagnetic sensor and it belongs to high sensitivity in the magnetic sensors of the prior art.

The magnetic sensor using magnetic bridge of the present invention also pertains to coil pickup sensor of the above sensors and is characterized mainly in that it can be made up of only coils and magnetic material. These components are inexpensive since they can be manufactured of very general raw material, and special facilities for manufacturing them are not required. Accordingly, the present invention is characterized in that the magnetic sensor with high precision can be made inexpensively.

Now, in the coil pickup sensors, the difference between the magnetic sensor using the magnetic bridge of the present invention and the flux gate magnetometer is described.

In the flux gate magnetometer, a flux detecting coil is wound around the magnetic core through which the detected magnetic field is passed, and then excitation and non-excitation alternate at high speed until the magnetic core is saturated magnetically without the detecting coil and the flux intersected. In this flux gate magnetometer, it is necessary for the flux of an exciting coil to be arranged not to generate any electromotive force across the detecting coil. Because of this, with respect to the permeability of magnetic core in the flux gate magnetometer, low permeability and high permeability alternate at high speed. Herein, the permeability becomes low when the excitation is carried out until the magnetic saturation, and high at the non-excitation.

Then, in the flux gate magnetometer, the increase and the decrease of the flux by the detected magnetic field alternate within the magnetic core. Namely, the flux within the magnetic core becomes strong or weak. As this, since, in the flux gate magnetometer, the variation of flux intensity within the magnetic core results in generating the electromotive force across the flux detecting coil wound around it, the magnetic field can be detected by detecting the electromotive force.

The point in the magnetic detection by this magnetometer is that the maximum of the flux repeating the strong and the weak within the magnetic core is the value determined by the intensity of the detected magnetic field and the permeability of magnetic core, and the strong and the weak of the flux is not more than the intensity of the detected magnetic field.

In the magnetic sensor using the magnetic bridge of the present invention, the flux passing through the flux detecting coil is due to the exciting coil (the exciting means), as known the description of the magnetic bridge. The detected magnetic field plays role in breaking the magnetic balance of magnetic bridge, and the flux leaking from the magnetic bridge is that generated by the exciting coil. Therefore, strengthening the excitation force of the exciting coil results in strengthening of the flux leaking from the magnetic bridge to the flux detecting coil such that the electromotive force of the flux detecting coil becomes larger. Then, the concerned flux can become much larger than the flux of the detected magnetic field.

Therefore, the magnetic sensor using the magnetic bridge of the present invention is made to have the sensitivity much higher than that of the flux gate magnetometer of the prior art. Also, this results in high precision.

As understood the above, with the magnetic sensor using the magnetic bridge of the present invention, manufacturing of the magnetic sensor of which the sensitivity and the precision are much higher than those of the magnetic sensor in the prior art and the cost is as same as that of the prior art is possible.

Next, the embodiment of the current sensor of the present invention is described by an example in which the full scale is ±1A and the resolution is 100 µA.

(a) As the middle leg magnetic circuit (1), the outer leg magnetic circuit (2a) and the outer leg magnetic circuit (2b), the parts formed by joining the opposite two of things based on JIS C2514, FE16B of an abbreviation of the model name were used.

(b) As the exciting means (3a) and the exciting means (3b), the coil made by winding a poly-urethane wire with the conductor diameter of 0.03 mm around a plastic bobbin 150 times was used.

(c) As the magnetic field detecting means (4), the coil made by winding a poly-urethane wire with the conductor diameter of 0.03 mm around a plastic bobbin 3,000 times was used. Further, between the both ends of the concerned detecting coil was connected with 2,200 pF, and the resonance about at 1 kHz was occurred, whereby the matching circuit was formed. The matching circuit may be employed, as needed, in the circuit where the frequency characteristic or impedance in the detecting coil and the detection circuit (8) are required to match.

(d) The balance recovery coil was formed by winding a poly-urethane wire with the conductor diameter of 0.1 mm around a plastic bobbin of the detecting coil 20 times.

(e) The coils used as the exciting means (3a) and exciting means (3b) were made to have the configuration where the alternating current of 500 Hz was run along them, since the detecting coil used as the flux detecting means (4) was made to resonate about at 1 kHz.

(f) The drive means (7) was made up of a oscillation circuit, a frequency dividing circuit and a output circuit, since the reference signal of 1 kHz was required in the phase detecting circuit to be described later.

(g) As the oscillation circuit, rectangular wave oscillation circuit with the oscillation frequency of 2 kHz was used in which the comparator IC was employed.

(h) The frequency dividing circuit was adapted to divide the frequency into ½ and ¼ by using CMOS IC such that 1 kHz and 500 Hz were obtained, respectively.

(i) The output of the drive circuit was passed through the variable resistor for adjustment of amplitude to be output by the operational amplifier. This output is output in the form of the rectangular wave, as it is, with the frequency of 500 Hz obtained by the frequency dividing circuit. While outputting the current in the form of sine wave results in higher precision, the output in the form of rectangular wave is employed considering that at the flux detecting means (4) or the detection circuit (8) is selectively detected the current with frequency of 1 kHz which is two times as high as that of the current running along the coil used as the exciting means (3a) and exciting means (4a) and that, in the rectangular wave, precision falls but the simplification of circuit is possible. Further, the use of general-purpose operational amplifier is possible since the output current of the drive circuit will do within 10 mA.

(j) The detection circuit (8) was made up of a matching circuit, a phase detecting circuit and a low-pass filter circuit.

Since, in the detecting coil used as the flux detecting means (4), the signals being detected are adapted to resonate about at 1 kHz, the power close to sine wave with frequency of 1 kHz is input to the detection circuit (8), even if the excitation current output by the output circuit is in the form of rectangular wave. The power close to sine wave is also obtained, if the current output by the output circuit is in the form of sine wave.

The phase detecting circuit detects the phase of signal obtained from the detecting coil, based on the reference signal with frequency of 1 kHz obtained from the frequency dividing circuit. In this embodiment, the reference signal is digital signal and the phase detecting circuit is the amplifier circuit of which the amplification factor is positive when the reference signal is at high-level (H) and is negative when at low-level (L). The output voltage of the phase detecting circuit indicates positive voltage when the detected current runs in a certain direction and indicates negative voltage when in reverse direction, and the magnitude of voltage is approximately proportional to that of the detected current. Also, when it is required to detect only the magnitude of the detected current, namely, when there is no need for detecting the polarity, the simple rectifier circuit may be used instead of the phase detecting circuit.

The form of signal wave is made up of pulsating current which includes a lot of the 2 kHz component. By smoothing this signal, the waveform close to the detected current can be obtained. The detected current includes the alternating current component to a certain degree, since the magnitude of the current vary substantially even if the current is direct current. To which extent the alternating current component can be detected depends on the capability of the current sensor, and, in this embodiment of the present invention, since the excitation current has the frequency of 500 Hz, up to 5 Hz which is 1/100 of the frequency, the detection with high precision is possible compared with the same kind of sensor in the prior art.

When it is required to detect both of the direct current and the commercial frequency current in the current sensor of the present invention, setting the excitation current about to 10 kHz results in good detection about up to 100 Hz such that the demand can be satisfied. Low-pass filter circuit has the transfer characteristic depending on the frequency and is made as the circuit formed by only passive elements, the circuit using active elements, etc., of which the purpose is to, of the signals obtained from the rectifier circuit or the phase detecting circuit in the preceding part, pass the low frequency component within desired frequency range to detect from direct current and block the high frequency component exceeding the desired frequency range. In this embodiment, the smoothing circuit formed by the most simple resistors and capacitors was employed. The output of this circuit reflects the waveform and magnitude corresponding to those of the detected current, when the current sensor in the present invention is not provided with the balance recovery coil (5).

In the present embodiment, to automatically determine the balance recovery current, the feedback method of output of the low-pass filter circuit by a balance recovery current controlling circuit (9) was employed and the feedback was carried out making the output of balance recovery coil (5) about by 100 times. In this embodiment, 1/20 of the detected current is sufficient for the balance recovery current since the turns of the balance recovery coil (5) is 20. Therefore, in the present embodiment where the current up to the maximum 1A is detectable, the output capability is set to 50 mA.

Further, in the present embodiment, the detected value outputting circuit (10) has the configuration where a resistor is connected with the balance recovery coil (5) in serial and then the voltage generated across the resistor is amplified by a amplifier. The output of this circuit reflects the waveform and magnitude corresponding to those of the detected current, when the current sensor in the present invention is provided with the balance recovery coil (5).

From the embodiments where the direct current was detected by the current sensor in the present invention, the very high sensitivity, precision, capability of the present invention compared with the prior art was verified.

When the detected current is not more than 10 mA, the detection results are shown in Table 1. And, when the detected current is not more than 100 mA, the detection results are shown in Table 2. The larger the detected current is, the more stable the precision is, and, in the case that the detected current is the range from more than 100 mA to the full scale of 1A, full scale errors are not more than 0.2%. In the case that the circuit element values are changed such that the full scale is 10 mA, the detection of 10 µA is verified.

TABLE 1

| detected current $I_x$ [mA] | detected value by embodiment $I_o$ [mA] | error $(I_o - I_x)/I_x$ [%] | full scale error $(I_o - I_x)/I_f$ [%] |
| --- | --- | --- | --- |
| −10.0 | −9.87 | −1.03 | −0.013 |
| −9.0 | −8.89 | −1.22 | −0.011 |
| −8.0 | −7.88 | −1.50 | −0.012 |
| −7.0 | −6.91 | −1.29 | −0.009 |
| −6.0 | −5.94 | −1.00 | −0.006 |
| −5.0 | −4.94 | −1.20 | −0.006 |
| −4.0 | −3.96 | −1.00 | −0.004 |
| −3.0 | −2.97 | −1.00 | −0.003 |

TABLE 1-continued

| detected current Ix [mA] | detected value by embodiment Io [mA] | error (Io − Ix)/Ix [%] | full scale error (Io − Ix)/If [%] |
|---|---|---|---|
| −2.0 | −1.97 | −1.50 | −0.003 |
| −1.0 | −0.98 | −2.00 | −0.002 |
| 0.0 | 0.01 | calculation incapable due to zero divisor | 0.001 |
| 1.0 | 1.01 | 1.00 | 0.001 |
| 2.0 | 2.01 | 0.50 | 0.001 |
| 3.0 | 3.02 | 0.67 | 0.002 |
| 4.0 | 4.03 | 0.75 | 0.003 |
| 5.0 | 5.04 | 0.80 | 0.004 |
| 6.0 | 6.05 | 0.83 | 0.005 |
| 7.0 | 7.04 | 0.57 | 0.004 |
| 8.0 | 8.07 | 0.88 | 0.007 |
| 9.0 | 9.03 | 0.33 | 0.003 |
| 10.0 | 10.00 | 0.00 | 0.000 |

TABLE 2

| detected current Ix [mA] | detected value by embodiment Io [mA] | error (Io − Ix)/Ix [%] | full scale error (Io − Ix)/If [%] |
|---|---|---|---|
| −100.0 | −100.2 | 0.20 | 0.020 |
| −90.0 | −90.1 | 0.11 | 0.010 |
| −80.0 | −80.2 | 0.25 | 0.020 |
| −70.0 | −70.1 | 0.14 | 0.010 |
| −60.0 | −60.1 | 0.17 | 0.010 |
| −50.0 | −50.2 | 0.40 | 0.020 |
| −40.0 | −40.3 | 0.75 | 0.030 |
| −30.0 | −30.3 | 1.00 | 0.030 |
| −20.0 | −19.8 | −1.00 | −0.020 |
| −10.0 | −9.9 | −1.00 | −0.010 |
| 00.0 | 0.00 | 0.00 | 0.000 |
| 10.0 | 9.9 | 1.00 | −0.010 |
| 20.0 | 19.7 | −1.50 | −0.030 |
| 30.0 | 29.5 | −1.67 | −0.050 |
| 40.0 | 39.4 | −1.50 | −0.060 |
| 50.0 | 49.2 | −1.60 | −0.080 |
| 60.0 | 59.1 | −1.50 | −0.090 |
| 70.0 | 70.1 | 0.14 | 0.010 |
| 80.0 | 80.1 | 0.12 | 0.010 |
| 90.0 | 90.1 | 0.11 | 0.010 |
| 100.0 | 100.1 | 0.10 | 0.010 |

The symbols used in the present specification and drawings are shown in Table 3 and Table 4.

TABLE 3

The brief description of the symbols relating to electromagnetic used in the specification
The list of simple symbols
One outer leg magnetic circuit indicated as A
The other outer leg magnetic circuit indicated as B
The middle leg magnetic circuit indicated as C

| kind | specification | unit | the brief description of the specified symbol |
|---|---|---|---|
| $\phi$ | $\phi_a$ | Wb | the flux of outer leg magnetic circuit A |
| | $\phi_b$ | | the flux of outer leg magnetic circuit B |
| | $\phi_b$ | | the flux of outer leg magnetic circuit C |
| $\mu$ | $\mu_i$ | Wb/A · m | the initial permeability of magnetic material |
| | $\mu_m$ | | the maximum permeability of magnetic material |
| N,n | n | Turn | the turns of exciting coil (exciting means) |
| | $N_x$ | or | the turns of detected wire |

TABLE 3-continued

The brief description of the symbols relating to electromagnetic used in the specification
The list of simple symbols
One outer leg magnetic circuit indicated as A
The other outer leg magnetic circuit indicated as B
The middle leg magnetic circuit indicated as C

Figure 3:
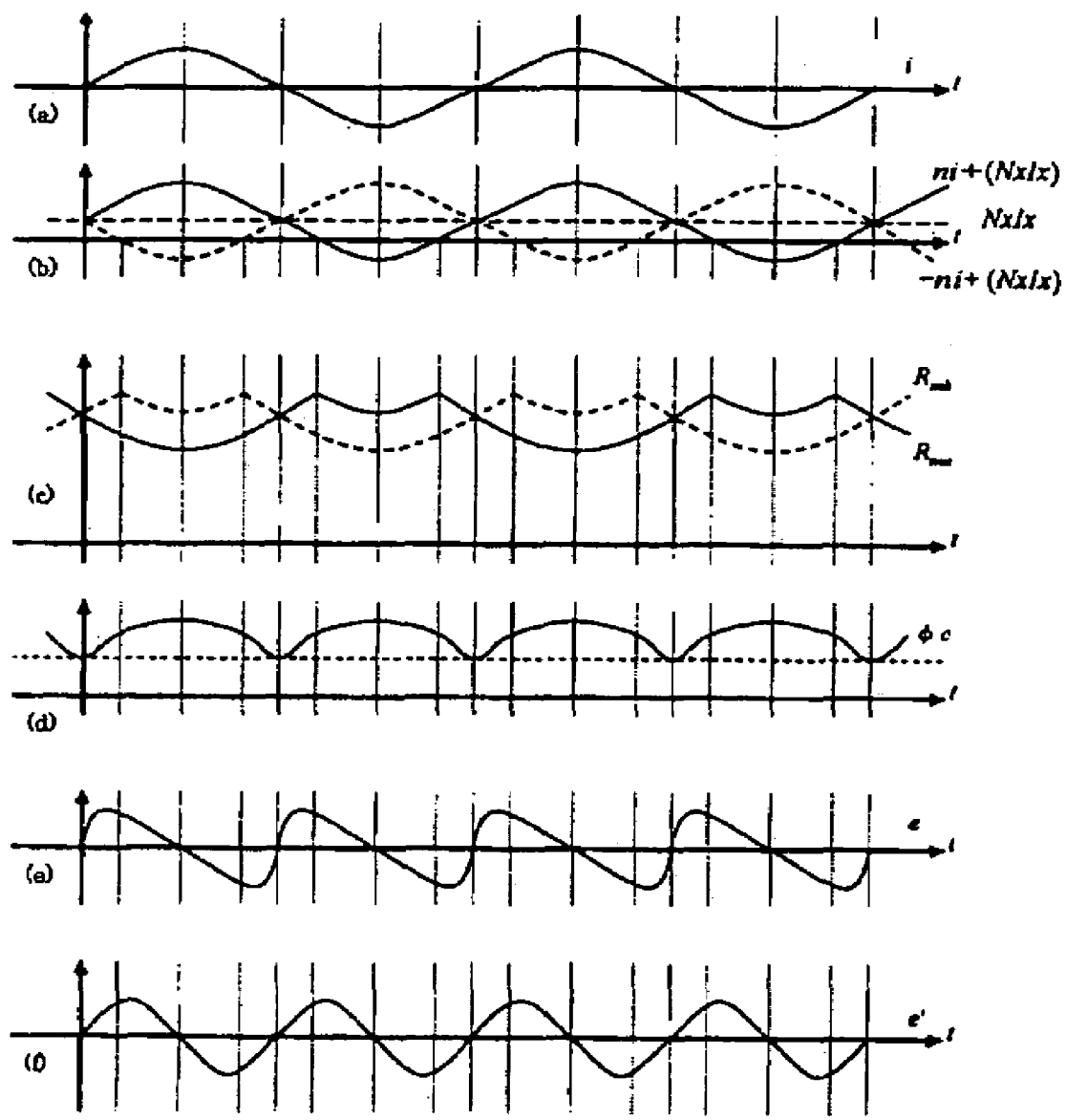
FIG. 3 shows the waveforms in respective parts of the current sensor of the present invention when the detected current is running, in which (a) relates to exciting current, (b) relates to the magnetic field of outer leg magnetic circuits, (c) relates to the magnetic reluctance of outer leg magnetic circuits, (d) relates to the flux of a middle leg magnetic circuit, (e) relates to the electromotive force generated across a flux detecting means (detecting coil), and (f) relates to the respective fundamental waves of the electromotive force generated across the flux detecting means (detecting coil)
Figure 4:
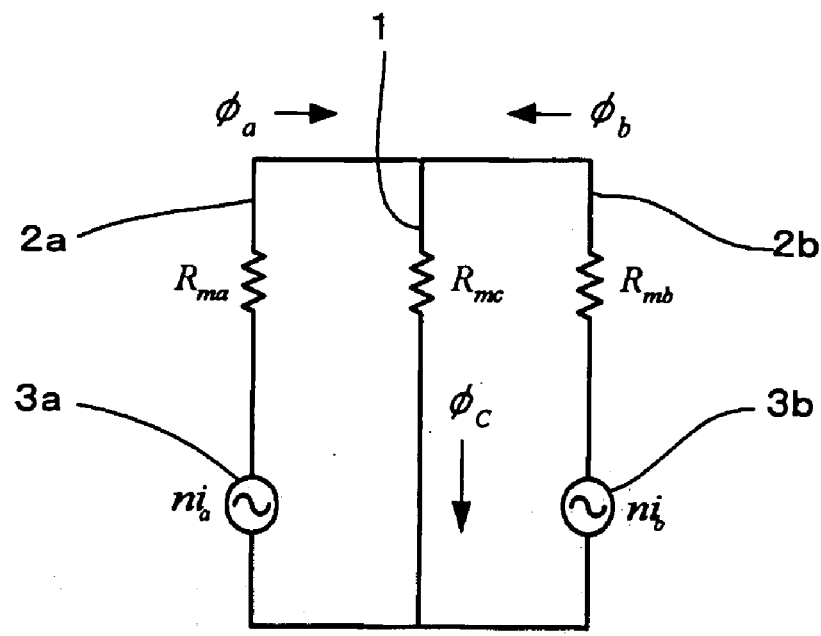
FIG. 4 shows an equivalent magnetic circuit when the detected current is not running, in the current sensor of the present invention.

| kind | specification | unit | the brief description of the specified symbol |
|---|---|---|---|
| | $N_o$ | times | the turns of balance recovery coil (balance recovery exciting means) |
| I,i | $i_a$ | A | the current running along the exciting coil A |
| | $i_b$ | | the current running along the exciting coil B |
| | $I_x$ | | the detected current |
| | $I_o$ | | the balance recovery current |
| $R_m$ | $R_{ma}$ | A/Wb | the magnetic reluctance of outer leg magnetic circuit A |
| | $R_{mb}$ | | the magnetic reluctance of outer leg magnetic circuit B |
| | $R_{mc}$ | | the magnetic reluctance of middle leg magnetic circuit C |
| S | S | m² | the cross section of magnetic path |
| l | l | m | the length of magnetic path |
| H | $H_a$ | AT/m | the intensity of magnetic field when the permeability of magnetic material becomes maximum |
| B | B | Wb/m² | the flux density |
| t | t | Sec | time |
| e | e | V | In FIG. 3, electromotive force generated across the detecting coil |
| | $e^1$ | | the fundamental component of electromotive force generated across the detecting coil |

TABLE 4

The brief description of the symbols relating to electromagnetic used in the specification
The list of complex symbols

Figure 9:
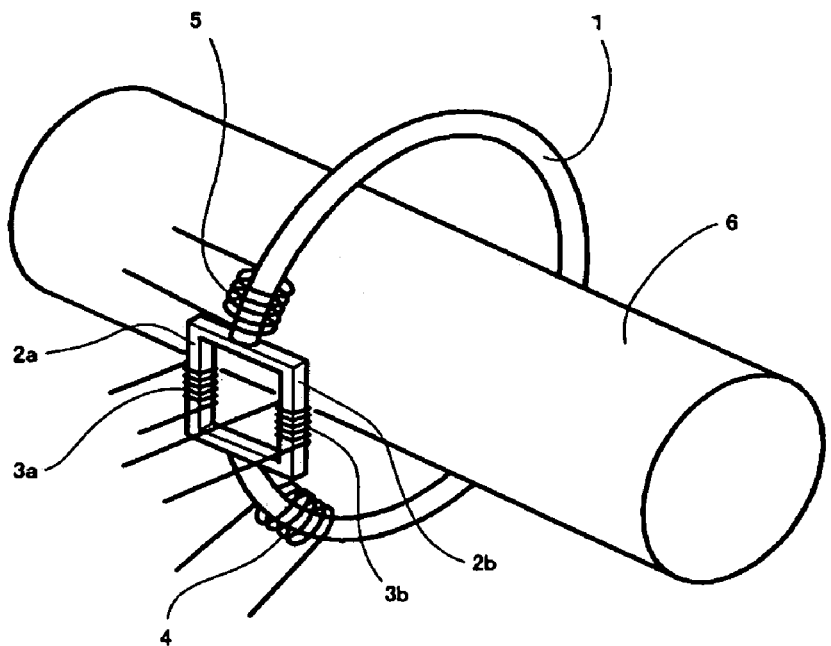
FIG. 9 is a perspective view of an application to the current sensor of the present invention.
Figure 10:
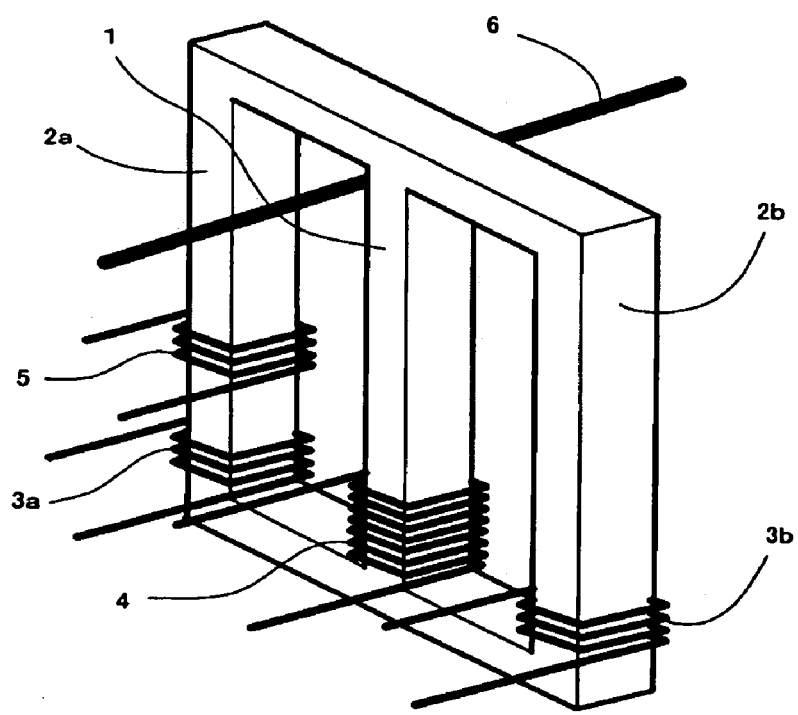
FIG. 10 is a perspective view of the main portion of the current sensor of the present invention in which the detected wire is only passed through one window surrounded by the middle leg magnetic circuit and any one of the outer leg magnetic circuits.

| kind | specification | unit | the brief description of the specified symbol |
|---|---|---|---|
| N,n I,i | ni | AT | when the current running along one exciting coil is indicated as i, magnetomotive force generated by the coil |
| | −ni | | when the current running along the other exciting coil is indicated as −i, magnetomotive force generated by the coil |
| | $N_x I_x$ | | the magnetomotive force generated by the detected current to the magnetic circuit around which the detected wire is wound (the most of flux generated by the magnetomotive force is generated, in FIG. 1, FIG. 2, FIG. 5, FIG. 6, FIG. 9, along the middle leg magnetic circuit, in FIG. 10, along the outer leg magnetic circuit 2a) |
| | $N_o I_o$ | | the magnetomotive force generated by the balance recovery current to the magnetic circuit around which the balance recovery wire is wound (the most of flux generated by the magnetomotive force is generated, in FIG. 2, FIG. 6, FIG. 9, along the middle leg magnetic circuit, in FIG. 10, along one outer leg magnetic circuit 2a) |

INDUSTRIAL AVAILABILITY

In the detection by the present invention, when the detected current is zero, the flux passing through the flux detecting means (4) is zero since the magnetic condition in the magnetic bridge is under magnetic balance condition.

In contrast, in the current detecting method by magnetic amplifier type, magnetic multi vibrator type, magnetic flux inversion time difference type, etc. of the prior art, excitation flux is always being generated in these magnetic circuits, since a magnetic core of soft magnetic material is magnetically excited in advance to the vicinity of saturation flux density by alternating current of the coil wound around the core such that it is magnetically polarized by the detected current, whereby the detected current is detected.

Considering the difference between the present invention and the prior art from the point of the amount of information, in the method of the prior art, the separation and extraction of the information relating to only the detected current from the entire information was not easy since the information of the detected current and the excitation flux is mixed and, also, the amount of information relating to excitation flux is far much than that relating to the detected current.

However, in the present invention, all the magnitude and polarity components in the detection results are considered as the information of the detected current since the magnetic condition in the magnetic bridge is under magnetic balance condition, and the frequency component in the detection results is the frequency component information of excitation flux. That is, in the method of the present invention, it is possible to easily extract even a small amount of information since there is no need for separation of information so long as the magnitude and polarity in the detection results are utilized. In other words, in the present invention, the current detection with the higher sensitivity can be carried out more easily.

In addition, in the magnetic amplifier type, magnetic multi vibrator type and magnetic flux inversion time difference type of the prior art, the excitation flux is required to be strengthened such that it reaches the magnetic saturation area and, therefore, the excitation flux becomes the strong one reaching up to the magnetic saturation area, however, in the present invention, the weak one not more than the maximum permeability is sufficient for the excitation flux, and, therefore, the difference, in the amount of information relating to the detected current, between the present invention and the prior art is distinguished. As a result of this characteristic, micro current of 100 µA which is not detectable in the prior art is at least detectable in the present invention.

Since the detection sensitivity becomes better proportional to the turns (passing-through times) of the detected wire and the more turns of the detected wire results in the higher sensitivity in the method of the present invention and also in the method of the prior art such as the magnetic amplifier type, magnetic multi vibrator type, magnetic flux inversion time difference type, etc., it may be considered to increase the turns of the detected wire for the detection of the more minute current utilizing this characteristic, however, in the method of the prior art represented as the magnetic amplifier type, magnetic multi vibrator type and magnetic flux inversion time difference type, the excitation flux is always being generated along the magnetic circuit around which the detected wire is wound, and thus the electromotive force is generated across the detected wire by the excitation flux such that the current by the electromotive force is superposed on the detected current.

As described above, the little the detected current is, the relatively larger the current superposed by the excitation flux on the detected current is, and therefore it is noisy and harmful to the detected current, however, it is desired to increase the turns of the detected wire since the higher sensitivity is required in the case that the detected current is less. But, in the prior art, there is always the problem that the more turns of the detected wire results in increasing the current superposed by the excitation flux on the detected current, and it is impossible to resolve this problem. Namely, in the method of the prior art represented as the magnetic amplifier type, the magnetic multi vibrator type and the magnetic flux inversion time difference type, there is a limit to the improvement of sensitivity by the increase of the turns of the detected wire.

In the present invention, the detected wire is arranged, as shown in FIG. 2, to be passed through one window formed by being surrounded by the outer leg magnetic circuit and the middle leg magnetic circuit from the front side to the opposite side and also be passed through the other window formed by being surrounded by the outer leg magnetic circuit and the middle leg magnetic circuit from the opposite side to the front side such that, under magnetic balance condition and magnetic re-balance condition, the excitation flux is not present in the middle leg magnetic circuit around which the detected wire is wound, and, therefore, the special merit is that the current superposed by the excitation flux on the detected current is not generated. Further, even under magnetic quasi-balance condition, there is only the extremely minute excitation flux and, therefore, the current superposed by the excitation flux on the detected current is extremely minute.

In addition, the merit of the present invention is that the minute current is detectable in the case of only 1 turn of the detected wire, the turns of the detected wire can also be increased easily according to the above-mentioned characteristic such that the more minute current is detectable, and, also, the noise harmful to the detected current is not generated. Further, since the present invention is operable even with the excitation flux not more than the maximum permeability of magnetic material such that a little energy is sufficient for the excitation, the current sensor with energy saved can be achieved.

Next, in the present invention, if ferrite core is used as the core material of the magnetic bridge, the drive frequency of exciting means can be made to high frequency reaching hundreds of kHz such that the detected current with frequency up to several kHz can be detected, and, therefore, it is possible to detect the current in which the current from the direct current to several kHz and the alternating current is mixed.

In the present invention, the flux in the middle leg magnetic circuit is extremely minute, under magnetic quasi-balance condition of the magnetic bridge, relative to the flux in the outer leg magnetic circuit and, therefore, the influence of the magnetic reluctance of middle leg magnetic circuit by the flux remaining in the middle leg magnetic circuit is negligible such that there is no practical problem, so long as the difference between the mechanical dimensions of the middle leg magnetic circuit and the outer leg magnetic circuit is not distinguished, for example, not 1000 times.

As described previously, in the present invention, the flux generated within the magnetic bridge by the detected current, under the magnetic quasi-balance condition, is extremely minute and, therefore, it is possible to make the magnetic bridge under the magnetic quasi-balance condition by sufficient feedback even if the detected current without feedback has the value magnetically saturating the magnetic bridge completely or the large value much exceeding the former. For example, in the embodiment of FIG. 2, it is possible to achieve the magnetic quasi-balance condition by the balance recovery current defined within the given range by arranging a tap on the way of the winding of balance recovery coil, using the position of a little turns when the detected current is a little and using the tap of the far more turns in accordance with the increase of the detected current and, therefore, a variety of the detected current from the minute current to the large current can be detected by the same magnetic bridge, with the output capability of the balance recovery current controlling circuit for run the balance recovery current fixed within the given range.

Further, in the present invention, the flux present in the middle leg magnetic circuit, under the magnetic quasi-balance condition of the magnetic bridge, is extremely minute and, therefore, the influence of the magnetic characteristic of middle leg magnetic circuit on the sensitivity and precision of the current sensor in the present invention is extremely minute. That is, it is possible to modify the middle leg magnetic circuit such that its shape is made to easily pass the detected wire therethrough as indicated in the embodiment of FIG. 9, since, even if the magnetic reluctance of middle leg magnetic circuit is changed by the modification of the middle leg magnetic circuit, the influence of the change on the precision and sensitivity is extremely minute. As a result, even if its structure is adapted to be opened and closed by cutting the middle leg magnetic circuit or to be removable such that it is possible to clamp to the detected wire of which the wiring is completed previously to detect the current, the clamp type current sensor with high precision can be implemented since the influence of the magnetic characteristic of middle leg magnetic circuit on the sensitivity and precision of the current sensor is extremely minute.

In addition, the magnetic field to permeability characteristic (see the FIG. 7) is non-linear at the permeability not more than the maximum permeability and this non-linear characteristic generally decrease the detection precision, however, in the present invention, the flux remaining in the middle leg magnetic circuit, namely, the flux generated within the magnetic bridge by the detected current is extremely minute, the non-linear characteristic of magnetic field to permeability within this minute range is not distinguished such that the characteristic can be considered as linear, and the decrease of detection precision due to the non-linear characteristic of magnetic field to permeability is negligible. This feature of the present invention together with the characteristic of magnetic bridge results in manufacturing the products with high precision or inexpensive products, since, even if the non-uniformity in the characteristic of magnetic material occurs when mass-producing, it is difficult for the non-uniformity to give influence on the characteristic of the current sensor.

The invention is claimed is:

1. A current sensor, comprising:
   one middle leg magnetic circuit having opposite ends;
   two outer leg magnetic circuits each connected to one of the opposite ends of the middle leg magnetic circuit, respectively;
   an exciting means arranged in each of the outer leg magnetic circuits;
   a flux detecting means arranged in the middle leg magnetic circuit;
   drive means for driving the exciting means; and
   a detection circuit connected with the flux detecting means and outputting the electric signals interlocked with the flux being detected by the flux detecting means.

2. A current sensor according to claim 1, further comprising:
   a balance recovery coil arranged by winding a wire around at least one of the middle leg magnetic circuit and the outer leg magnetic circuits;
   a balance recovery current controlling circuit for controlling the balance recovery current run along the balance recovery coil to decrease the flux being detected by the flux detecting means, based on the electric signals being output from the detection circuit; and
   a detected value outputting circuit for outputting the balance recovery current value.

3. A current detecting method, comprising:
   achieving magnetic balance condition by generating a first excited flux which is an alternating flux to run along a middle leg magnetic circuit by an exciting means and generating a second excited flux, of which the magnitude is the same as that of the first excited flux and the direction is reverse to that of the first excited flux, the second flux being an alternating flux to run along the middle leg magnetic circuits by an exciting means;
   achieving magnetic non-balance condition due to collapse of the magnetic balance condition, which is caused by running detected current along a detected wire passed through at least one of a window which is formed by being surrounded by a first outer leg magnetic circuit and the middle leg magnetic circuit and a window which is formed by being surrounded by a second outer leg magnetic circuit and the middle leg magnetic circuit to vary the magnetic reluctance of the first outer leg magnetic circuit and the second outer leg magnetic circuit; and
   detecting the detected current running along the detected wire by detecting the flux which is generated along the middle leg magnetic circuit through achieving the magnetic non-balance condition, by a detection circuit outputting the electric signals interlocked with the flux being detected by a flux detecting means.

4. A current detecting method, comprising:
   achieving magnetic balance condition by generating a first excited flux which is an alternating flux to run along a middle leg magnetic circuit by an exciting means and generating a second excited flux, of which the magnitude is the same as that of the first excited flux and the direction is reverse to that of the first excited flux, the second excited flux being an alternating flux to run along the middle leg magnetic circuit by an exciting means;
   achieving magnetic non-balance condition due to collapse of the magnetic balance condition, which is caused by running detected current along a detected wire passed through at least one of a window which is formed by being surrounded by a first outer leg magnetic circuit and the middle leg magnetic circuit and a window which is formed by being surrounded by a second outer leg magnetic circuit and the middle leg magnetic circuit to vary the magnetic reluctance of the first outer leg magnetic circuit and the second outer leg magnetic circuit;
   achieving magnetic re-balance condition by running balance recovery current along a balance recovery coil to decrease the flux being generated along the middle leg magnetic circuit in the condition that magnetic reluctance of the first outer leg magnetic circuit and the second outer leg magnetic circuit is varied, wherein the balance recovery current, which generates the flux of which the magnitude is as same as that of the flux being generated along the magnetic circuit around which the detected wire is wound by being passed therethrough in the condition that the magnetic reluctance of the first outer leg magnetic circuit and the second outer leg magnetic circuit is varied and the direction is reverse to that of the said flux, is run along the balance recovery coil which is wound by being passed through the same window as the window through which the detected wire is passed; and detecting the detected current running along the detected wire by detecting the balance recovery current running along the balance recovery coil in the magnetic re-balance condition.

5. A current sensor, comprising:

a first magnetic circuit having opposite ends;

second and third magnetic circuits each having opposite ends, wherein the respective one ends of the second and third magnetic circuits are connected with one end of the first magnetic circuit;

fourth and fifth magnetic circuits each having opposite ends, wherein the respective one ends of the fourth and fifth magnetic circuits are connected with the other end of the first magnetic circuit, and the other ends of the fourth and fifth magnetic circuits are connected with the second and third magnetic circuits, respectively;

a sixth magnetic circuit having opposite ends, wherein one and the other ends of the sixth magnetic circuit are connected with a contact between the second and fourth magnetic circuits and a contact between the third and fifth magnetic circuits, respectively;

an exciting means arranged to generate a flux along the sixth magnetic circuit;

a flux detecting means arranged to detect a flux of the first magnetic circuit;

a drive means for driving the exciting means; and a detection circuit connected with the flux detecting means and outputting the electric signals interlocked with the flux being detected by the flux detecting means.

6. A current sensor according to claim 5, wherein, in the case that the exciting means is a coil, the coil is arranged to be passed at least one time through both of the window surrounded by the second and third magnetic circuits and the sixth magnetic circuit and the window surrounded by the fourth and fifth magnetic circuits and the sixth magnetic circuit.

7. A current sensor according to claim 5, wherein, in the case that the flux detecting means is a coil, the coil is arranged to be passed at least one time through both of the window surrounded by the second and fourth magnetic circuits and the first magnetic circuit and the window surrounded by the third and fifth magnetic circuits and the first magnetic circuit.

8. A current sensor according to claim 5, wherein the first magnetic circuit, the second and fifth magnetic circuits, the third and fourth magnetic circuits, the sixth magnetic circuit and the exciting means form a magnetic bridge.

9. A current sensor according to claim 5, further comprising:

a balance recovery coil arranged in any position in the magnetic bridge formed by the first magnetic circuit, the second and fifth magnetic circuits, the third and fourth magnetic circuits, the sixth magnetic circuit and the exciting means;

a balance recovery current controlling circuit for controlling the balance recovery current run along the balance recovery coil to decrease the flux being detected by the flux detecting means, based on the electric signals being output from the detection circuit; and a detected value outputting circuit for outputting the balance recovery current value.

10. A current detecting method, comprising:

achieving magnetic balance condition in which the flux by an exciting means is not present in a first magnetic circuit, by properly selecting the magnetic reluctance of second, third, fourth and fifth magnetic circuits to equalize magnetic potential of the opposite ends of the first magnetic circuit;

achieving magnetic non-balance condition due to collapse of the magnetic balance condition, which is caused by running detected current along a detected wire passed through at least one of the window surrounded by the first, second and fourth magnetic circuits and the window surrounded by the first third and fifth magnetic circuits to vary the magnetic reluctance of at least one of the second, third, fourth and fifth magnetic circuits; and detecting the detected current running along the detected wire by detecting a flux which is generated along the first magnetic circuit through achieving the magnetic non-balance condition, by a detection circuit outputting the electric signals interlocked with the flux being detected by a flux detecting means.

11. A current detecting method, comprising:

achieving magnetic re-balance condition by running balance recovery current along a balance recovery coil to return to the magnetic reluctance prior to variation the varied magnetic reluctance of the magnetic circuit of which the magnetic reluctance is varied and thus decrease a flux being generated along a first magnetic circuit in the condition that the magnetic reluctance of at least one of second, third, fourth and fifth magnetic circuits is varied, wherein the balance recovery current, which generates a first flux of which the magnitude is as same as that of a second flux being generated along the magnetic circuit around which a detected wire is wound by being passed therethrough in the condition that the magnetic reluctance of at least one of the second, third, fourth and fifth magnetic circuits is varied and the direction is reverse to that of the second flux, is run along the balance recovery coil which is wound by being passed through the same window as the window through which the detected wire is passed; and detecting the detected current running along the detected wire by detecting the balance recovery current running along the balance recovery coil in the magnetic re-balance condition.

12. A magnetic bridge, comprising:

one middle leg magnetic circuit having opposite ends;

first and second outer leg magnetic circuits each connected to one of the opposite ends of the middle leg magnetic circuit, respectively;

a first exciting means arranged in the first outer leg magnetic circuit and a second exciting means arranged in the second outer leg magnetic circuit;

a flux detecting means arranged in the middle leg magnetic circuit; and drive means for driving each of the exciting means;

wherein the magnetic bridge achieves magnetic balance condition by generating a first excited flux which is an alternating flux to run along the middle leg magnetic circuit by the first exciting means and generating a second excited flux, of which the magnitude is as same as that of the first excited flux and the direction is reverse to that of the first excited flux, which is an alternating flux to run along the middle leg magnetic circuit by the second exciting means.

13. A magnetic bridge, comprising:

a first magnetic circuit having opposite ends;

second and third magnetic circuits having opposite ends, wherein the respective one ends of the second and third magnetic circuits are connected with one end of the first magnetic circuit;

fourth and fifth magnetic circuits having opposite ends, wherein the respective one ends of the fourth and fifth magnetic circuits are connected with the other end of the first magnetic circuit, and the other ends of the fourth and fifth magnetic circuits are connected with the second and third magnetic circuits, respectively;

a sixth magnetic circuit having opposite ends, wherein one and the other ends of the sixth magnetic circuit are connected with a contact between the second and fourth magnetic circuits and a contact between the third and fifth magnetic circuits, respectively;

an exciting means arranged to generate a flux along the sixth magnetic circuit;

a flux detecting means arranged to detect the flux of the first magnetic circuit; and a drive means for driving the exciting means;

wherein the magnetic bridge achieves magnetic balance condition in which the flux by the exciting means is not present in the first magnetic circuit, by properly selecting the magnetic reluctance of the second, third, fourth and fifth magnetic circuits to equalize magnetic potential of the opposite ends of the first magnetic circuit.

14. A magnetic bridge, comprising:

first and second magnetic circuits having opposite ends, wherein one ends of the first and second magnetic circuits are connected;

third and fourth magnetic circuits having opposite ends, wherein one ends of the third and fourth magnetic circuits are connected, and the other ends of the third and fourth magnetic circuits are connected with the first and second magnetic circuits, respectively;

a fifth magnetic circuit having opposite ends, wherein one and the other ends of the fifth magnetic circuit are connected with a contact between the first and third magnetic circuits and a contact between the second and fourth magnetic circuits, respectively;

an exciting means arranged to generate a flux along the fifth magnetic circuit; and a drive means for driving the exciting means; wherein the magnetic bridge achieves magnetic balance condition in which magnetic potential of the contact between the first and second magnetic circuits and the contact between the third and fourth magnetic circuits is equalized by properly selecting the magnetic reluctance of the first, second, third and fourth magnetic circuits.

\* \* \* \* \*